(12) United States Patent
Tomita

(10) Patent No.: US 6,324,113 B1
(45) Date of Patent: Nov. 27, 2001

(54) SEMICONDUCTOR INTEGRATED CIRCUIT AND METHOD OF CONTROLLING SAME

(75) Inventor: Hiroyoshi Tomita, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/577,498

(22) Filed: May 24, 2000

(30) Foreign Application Priority Data

Sep. 22, 1999 (JP) ................................................. 11-268772

(51) Int. Cl.$^7$ ....................................................... G11C 7/00
(52) U.S. Cl. .................... 365/222; 365/185.25; 365/149; 365/189.01
(58) Field of Search ............................. 365/222, 185.25, 365/149, 189.01

(56) References Cited

U.S. PATENT DOCUMENTS

| | | | |
|---|---|---|---|
| 5,796,669 | * 8/1998 | Araki et al. ............................ | 365/222 |
| 5,963,497 | * 10/1999 | Holland ................................. | 365/222 |
| 6,028,805 | * 2/2000 | Higuchi ................................. | 365/222 |
| 6,172,935 | * 1/2001 | Wright et al. ......................... | 365/233 |

FOREIGN PATENT DOCUMENTS

| | | |
|---|---|---|
| 57-15286 | 1/1982 | (JP) . |
| 1-125013 | 5/1989 | (JP) . |

* cited by examiner

*Primary Examiner*—David Nelms
*Assistant Examiner*—Connie C. Yoha
(74) *Attorney, Agent, or Firm*—Arent Fox Kintner Plotkin & Kahn, PLLC

(57) ABSTRACT

A semiconductor integrated circuit comprising: a pair of memory cores in which identical data are written; a refresh signal generating circuit; a refresh controlling circuit; and a read controlling circuit. The memory cores are operated during each predetermined period as refresh cores for performing a refresh operation and as read cores for performing a read operation. The refresh core performs refresh and write operations. The read core performs read and write operations. The write cycle time defined as an operation specification is set longer than the time necessary for each of the memory cores to perform a write operation. Therefore, during the refresh core, the time difference between the write cycle and the write operation is summed up during a plurality of write cycles to create a predetermined time margin. This time margin is utilized to perform a refresh operation so that the performance of the refresh operation, in conflict with the write operation, does not show to the exterior of the semiconductor integrated circuit. That is, even if a write operation is performed throughout the refresh core period, it is possible to prevent the data in the memory cores from being damaged. This enables users to use the semiconductor integrated circuit without taking refresh operations into consideration.

19 Claims, 18 Drawing Sheets

| output of refresh core selecting circuit 12 | state of memory core | | output of command selecting circuit 24 | | | |
|---|---|---|---|---|---|---|
| | | signal name | refresh operation | read operation | write operation |
| SEL=L SWT=L | memory core CA (refresh core) | · RCMD (not input) · REF(enable) · WCMD(enable) | ADDRIN | REFADDR | | WAL |
| | | REFCON | REF | | |
| | | READ | | | WCL |
| | | WRITE | | | WDL |
| | | WDATAIN | | | |
| | memory core CB (read core) | · RCMD(enable) · REF(not input) · WCMD(enable) | ADDRIN | | ADDR | ADDR |
| | | REFCON | | | |
| | | READ | | RCMD | |
| | | WRITE | | | WCMD |
| | | WDATAIN | | | WDATA |
| SEL=H SWT=H | memory core CA (refresh core) | · RCMD(enable) · REF(not input) · WCMD(enable) | ADDRIN | | ADDR | ADDR |
| | | REFCON | | | |
| | | READ | | RCMD | |
| | | WRITE | | | WCMD |
| | | WDATAIN | | | WDATA |
| | memory core CB (read core) | · RCMD (not input) · REF(enable) · WCMD(enable) | ADDRIN | REFADDR | | WAL |
| | | REFCON | REF | | |
| | | READ | | | WCL |
| | | WRITE | | | WDL |
| | | WDATAIN | | | |

Fig. 6

| output of refresh core selecting circuit 12 | memory core C0A | memory core C0B | memory core C1A | memory core C1B |
|---|---|---|---|---|
| SEL=L SWT=L | refresh core | read core (BANK=0) | refresh core | read core (BANK=1) |
| SEL=H SWT=H | read core (BANK=0) | refresh core | read core (BANK=1) | refresh core |

Fig. 13

| output of refresh core selecting circuit 12 | memory core C0A | memory core C0B | memory core C1A | memory core C1B |
|---|---|---|---|---|
| SEL0A=H<br>SEL0B,1A,1B=L<br>SWT=L | refresh core | read core<br>(BANK=0) | — | read core<br>(BANK=1) |
| SEL0B=H<br>SEL0A,1A,1B=L<br>SWT=L | read core<br>(BANK=0) | refresh core | read core<br>(BANK=1) | — |
| SEL1A=H<br>SEL0A,0B,1B=L<br>SWT=H | — | read core<br>(BANK=0) | refresh core | read core<br>(BANK=1) |
| SEL1B=H<br>SEL0A,0B,1A=L<br>SWT=H | read core<br>(BANK=0) | — | read core<br>(BANK=1) | refresh core |

Fig. 16

SEMICONDUCTOR INTEGRATED CIRCUIT AND METHOD OF CONTROLLING SAME

BACKGROUND OF THE INVENTION

1. Field of the Invention

The present invention relates to a semiconductor integrated circuit having a plurality of memory cells including capacitors, and a method of controlling the same. In particular, the present invention relates to a semiconductor integrated circuit for automatically performing refresh operations to the memory cells and a method of controlling the same.

2. Description of the Related Art

In general, the semiconductor integrated circuits known as having a plurality of memory cells including capacitors include dynamic random access memories (DRAMs). DRAMs are suited for higher integration since their memory cells can be made in smaller configurations. The DRAMs, however, require refresh operations in order to retain data stored in the memory cells.

Meanwhile, the semiconductor integrated circuits known as aimed at both the usability of static RAMs (SRAMs) and the high integration of DRAMs include pseudo SRAMs (PSRAMs) and virtual SRAMs. PSRAMs and virtual SRAMs comprise controlling circuits for refresh operation and memory cores similar to those of DRAMs.

Pseudo SRAMs receive a refresh signal from the exterior, generate refresh addresses within the chips, and perform refresh operations to their memory cells. The pseudo SRAMs are detailed in NIKKEI ELECTRONICS 1986.9.22 (no.404) pp.199–217, Nikkei business publications.

Virtual SRAMs incorporate the time required for refresh operations into read cycles and write cycles so that the performances of the refresh operations do not show to the exterior. The virtual SRAMs are detailed in TOSHIBA REVIEW vol.41, no.3, 1986, pp.227–230 (TOSHIBA KK).

Now, in the case where a pseudo SRAM performs refresh operations during intervals between read and write operations, refresh signals must be supplied thereto from the exterior. Therefore, the system using a pseudo SRAM needs to have some controlling circuits such as a refresh timer mounted on its printed-wiring board. Besides, the refresh operations have to be taken into consideration for the circuit design and timing design of the system.

In a virtual SRAM, the cycle times required for read and write operations need to be longer than their actual values by the time required for a refresh operation. This leads to a problem of greatly extended access time.

Accordingly, although both types of the memories are aimed at the usability of SRAMs, their operation cannot be identical to that of SRAMs. Besides, it is not possible not to show their performances of refresh operations completely to the exterior of the chips.

SUMMARY OF THE INVENTION

An object of the present invention is to provide a semiconductor integrated circuit and a method of controlling the same in which the performance of a refresh operation does not show to the external system.

According to one of the aspects of a semiconductor integrated circuit in the present invention, the semiconductor integrated circuit comprises: a pair of memory cores each having a plurality of memory cells including capacitors, having written identical data; a refresh signal generating circuit; a refresh controlling circuit; and a read controlling circuit.

The refresh signal generating circuit generates a refresh signal for retaining the data written in the memory cells. The refresh controlling circuit supplies the refresh signal to one of the memory cores and operates the memory core during a predetermined period as a refresh core for performing refresh and write operations. The read controlling circuit supplies a read signal for reading the data from the memory cells, to one of the memory cores not supplied with the refresh signal and operates the memory core as a read core for performing read and write operations.

That is, a pair of memory cores is operated as refresh cores for performing a refresh operation during each predetermined period, and a read core for performing a read operation. Therefore, the read operation is performed in the read core without waiting when the read signal is supplied during a refresh operation. Consequently, the refresh operation, even in conflict with the read operation, is automatically performed and the performance does not show to the external system so that the system need not control the refresh operation. This enables users to use the semiconductor integrated circuit without taking a refresh operation into consideration.

Write cycle time defined as an operation specification, is set longer than the actual time necessary for each of the memory cores to perform a write operation. The sum of each time difference between each write cycle and write operation during a plurality of write cycles create a predetermined time margin. This time margin is utilized to perform a refresh operation so that the performance of the refresh operation in conflict with the write operation does not show to the external system. In other words, the data in the memory cores is not damaged even when a write operation is performed throughout the refresh core period.

According to another aspect of the semiconductor integrated circuit in the present invention, the predetermined period where the memory core operates as the refresh core, is set so that the sum of each time difference between each write cycle and write operation is equal to or longer than a refresh cycle period. Therefore, the refresh cycle can be reliably performed during the refresh core.

According to another aspect of the semiconductor integrated circuit in the present invention, a write holding circuit provided in each of the memory cores holds a write signal for use in a write operation on the memory cells.

The write signal supplied to the memory core during a refresh operation is held in the write holding circuit. The write operation of the write signal held in the write holding circuit is performed after the completion of the refresh operation. Subsequently, the write holding circuit holds the write signals supplied in sequence and the write operations are performed by using the held signals. The time difference between each write cycle and write operation is gradually accumulated in each write operation. In other words, the time taken for performing the refresh operation prior to the write operation is compensated by the time margins in the subsequent write cycles. Thus, the performance of the refresh operation in conflict with the write operation does not show to the external system so that the system need not control the refresh operation.

According to another aspect of the semiconductor integrated circuit in the present invention, the write holding circuit comprises the predetermined number of holding parts. Therefore, the time taken for performing a refresh operation prior to the write operation is reliably compensated by the time margins in the subsequent write cycles.

According to another aspect of the semiconductor integrated circuit in the present invention, a refresh holding circuit provided in each of the memory cores holds a refresh signal generated by are fresh signal generating circuit. When the refresh signal is supplied during a write operation, the refresh holding circuit temporarily holds the refresh signal. After the completion of the write operation, the held refresh signal is used to perform a refresh operation.

According to another aspect of the semiconductor integrated circuit in the present invention, each of the memory cores is cyclically operated as the refresh core, thereby preventing the data retained in the memory cells from being damaged.

According to another aspect of the semiconductor integrated circuit in the present invention, by performing a refresh operation at the beginning of its period where the memory core operates as the refresh core, the time taken for performing the refresh operation is gradually compensated by the time margins in the subsequent write cycles, which are the time differences between the write cycles and the write operations. Thus, the performance of the refresh operation in conflict with the write operation does not show to the external system so that the system need not control the refresh operation.

According to another aspect of the semiconductor integrated circuit in the present invention, a direct controlling circuit performs a write operation in synchronization with a write cycle when a memory core operates as a read core.

According to another aspect of the semiconductor integrated circuit in the present invention, an end signal is generated in each operation. The subsequent operation is initiated in synchronization with the end signal so that each operation is continuously performed to effectively keep the time margin, the time difference between the write cycle and the write operation.

According to another aspect of the semiconductor integrated circuit in the present invention, precharging a bit line in each operation completes the operation. Therefore, the semiconductor integrated circuit can be operated at the same timing as that of an SRAM.

According to another aspect of the semiconductor integrated circuit in the present invention, the memory core operating as the refresh core receives the activation of an end signal and performs a write operation by using a write signal held in a write holding circuit. This allows the continuous performance of write operations, thereby keeping the time margin at maximum, the time difference between the write cycle and the write operation.

According to another aspect of the semiconductor integrated circuit in the present invention, the memory cores perform a refresh operation with priority using their refresh priority circuits. This ensures the retention of the data written in the memory cells.

According to another aspect of the semiconductor integrated circuit in the present invention, the memory cores receive the activation of the end signal and perform a refresh operation by using the refresh signal held in the refresh holding circuit. Therefore, the refresh operation is reliably performed even when a refresh signal is received during a write operation or a read operation.

According to another aspect of the semiconductor integrated circuit in the present invention, an operation mode is readily determined by a command decoder. Subsequently, a read operation or a write operation is performed or the semiconductor integrated circuit enters a low power mode.

According to another aspect of the semiconductor integrated circuit in the present invention, each of the memory cores comprises a plurality of sense amplifiers for amplifying the signal level of the data retained in the memory cells in the read operation. The number of sense amplifiers to be operated in a refresh operation is greater than that of sense amplifiers to be operated in a read operation. This allows the extended intervals between the refresh operations, thereby facilitating the control of refresh operation. In a read operation, operating the smaller number of sense amplifiers leads to reducing the power consumption.

According to one of the aspects of a method of controlling a semiconductor integrated circuit in the present invention, a refresh signal for retaining data written in a plurality of memory cells including capacitors, is generated. This refresh signal is supplied to one out of a pair of memory cores. The memory core supplied with the refresh signal then operates during a predetermined period as a refresh core for performing refresh and write operations.

A read signal for reading data from the memory cells is supplied to one of the memory cores not supplied with the refresh signal. The memory core supplied with the read data then operates as a read core for performing read and write operations.

Therefore, a pair of memory cores is operated as refresh cores for performing a refresh operation during each predetermined period, and a read core for performing a read operation. Therefore, the read operation is performed in the read core without waiting when the read signal is supplied during a refresh operation. Consequently, the refresh operation, even in conflict with the read operation, is automatically performed and the performance does not show to the external system. This enables users to use the semiconductor integrated circuit without taking a refresh operation into consideration.

Write cycle time defined as an operation specification, is set longer than the actual time necessary for each of the memory cores to perform a write operation. The time differences between the write cycle and the write operation are accumulated during a plurality of write cycles and create a predetermined time margin. This time margin is utilized to perform a refresh operation so that the performance of the refresh operation in conflict with the write operation does not show to the external system. That is, the data in the memory cores is not damaged even when a write operation is performed throughout the refresh core period.

According to another aspect of the method of controlling a semiconductor integrated circuit in the present invention, a predetermined period where the memory core operates as the refresh core, is set so that the sum of each time difference between each write cycle and write operation is equal to or longer than a refresh cycle period. Therefore, a refresh cycle can be reliably performed during the refresh core.

According to another aspect of the method of controlling a semiconductor integrated circuit in the present invention, each of the memory cores holds a write signal supplied during a refresh operation. The write operation of the write signal held in the write holding circuit is performed after the completion of the refresh operation. By holding the write signals supplied in sequence after the refresh operation, the time difference (time margin) between each write cycle and write operation is gradually accumulated. In other words, the time taken for performing the refresh operation prior to the write operation is compensated by the time margins in the subsequent write cycles. Thus, the performance of the refresh operation in conflict with the write operation does not show to the external system so that the system need not control the refresh operation.

According to another aspect of the semiconductor integrated circuit in the present invention, each of the memory cores holds a refresh signal supplied during a write operation. Then, the refresh operation of the held refresh signal is performed after the write operation. Therefore, the refresh signal can be temporarily held so that the refresh operation is performed after the completion of the write operation when the refresh signal is supplied during the write operation.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 6 is an explanatory diagram showing an overview of the control states for the memory cores in the first embodiment;

FIG. 13 is an explanatory diagram showing an overview of the control states for the memory cores in the second embodiment;

FIG. 16 is an explanatory diagram showing an overview of the control states for the memory cores in the third embodiment;

DESCRIPTION OF THE PREFERRED EMBODIMENT

Figure 1:
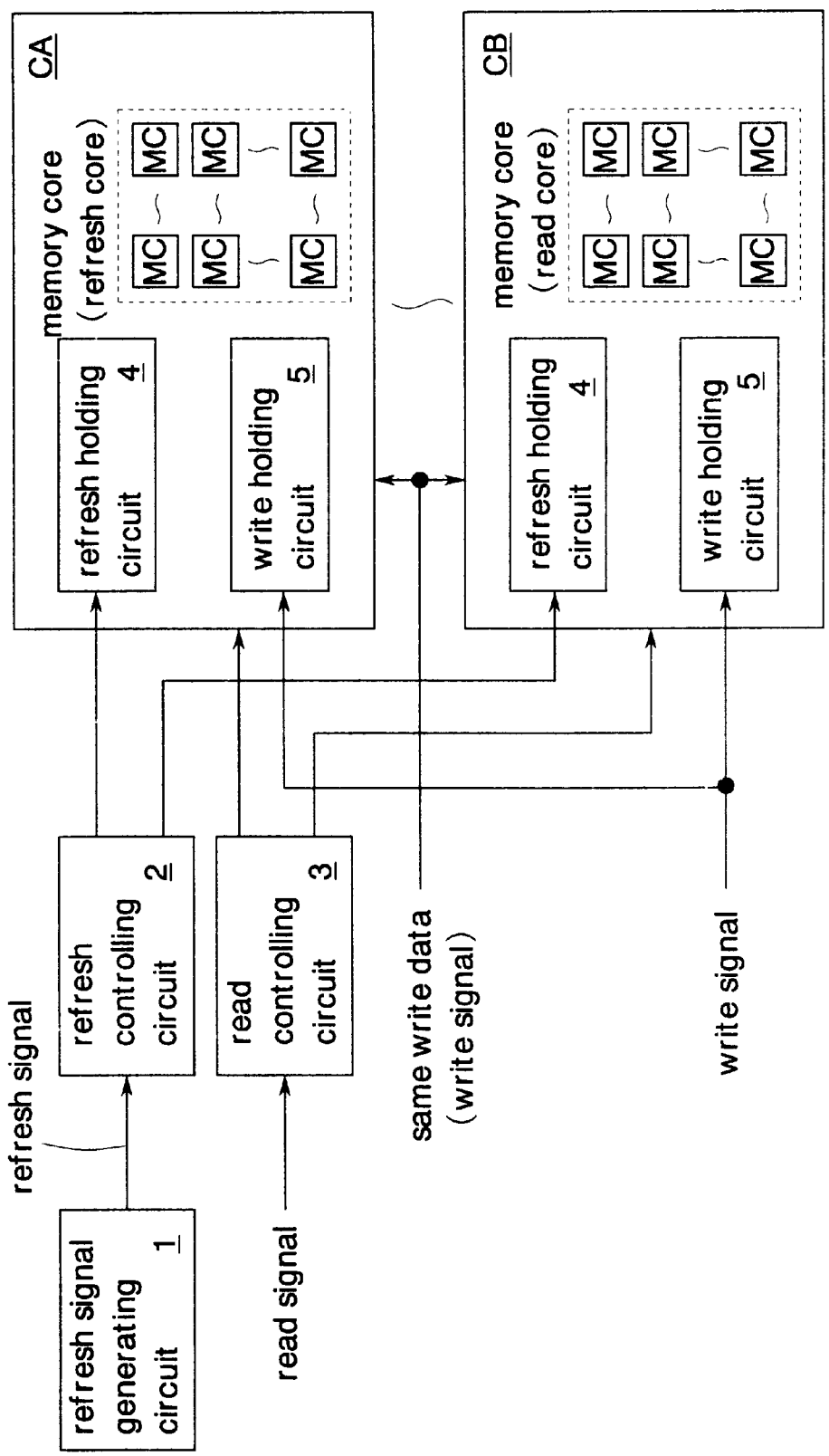
FIG. 1 is a block diagram showing the basic principle of the present invention.

FIG. 1 is a block diagram showing the basic principle of the present invention.

The semiconductor integrated circuit comprises: at least a pair of memory cores CA and CB each having a plurality of memory cells MC including capacitors, identical data being written to the memory cores; a refresh signal generating circuit 1; a refresh controlling circuit 2; and a read controlling circuit 3.

The refresh signal generating circuit 1 automatically generates a refresh signal for retaining data written to the memory cells MC. The refresh controlling circuit 2 supplies the refresh signal to at least one of the memory cores CA and CB, and operates the memory core CA (or CB) for a predetermined period as a refresh core for performing refresh and write operations. The read controlling circuit 3 supplies a read signal for reading data from the memory cells MC, to at least one of the memory cores CA and CB not supplied with the refresh signal, and operates the memory core CB (or CA) as a read core for performing read and write operations.

Here, write cycle time, which is an operation specification, is set to be longer than the time for each memory core CA, CB to perform a write operation. The time difference between the write cycle and the write operation is summed up during a plurality of write cycles to create a predetermined time margin. This time margin can be utilized to perform a refresh operation so that the performance of the refresh operation in conflict with write operations does not show to the external system.

The write signal supplied to the memory core CA, CB during a refresh operation is held by a write holding circuit 5. The write operation corresponding to the write signal held in the write holding circuit 5 is performed after the refresh operation.

When the refresh signal is supplied during a write operation, a refresh holding circuit 4 provided in the memory core CA, CB holds the refresh signal temporarily. After the completion of the operation, the held refresh signal is used to perform a refresh operation.

Hereinafter, the embodiments of the present invention will be described with reference to the drawings.

Figure 2:
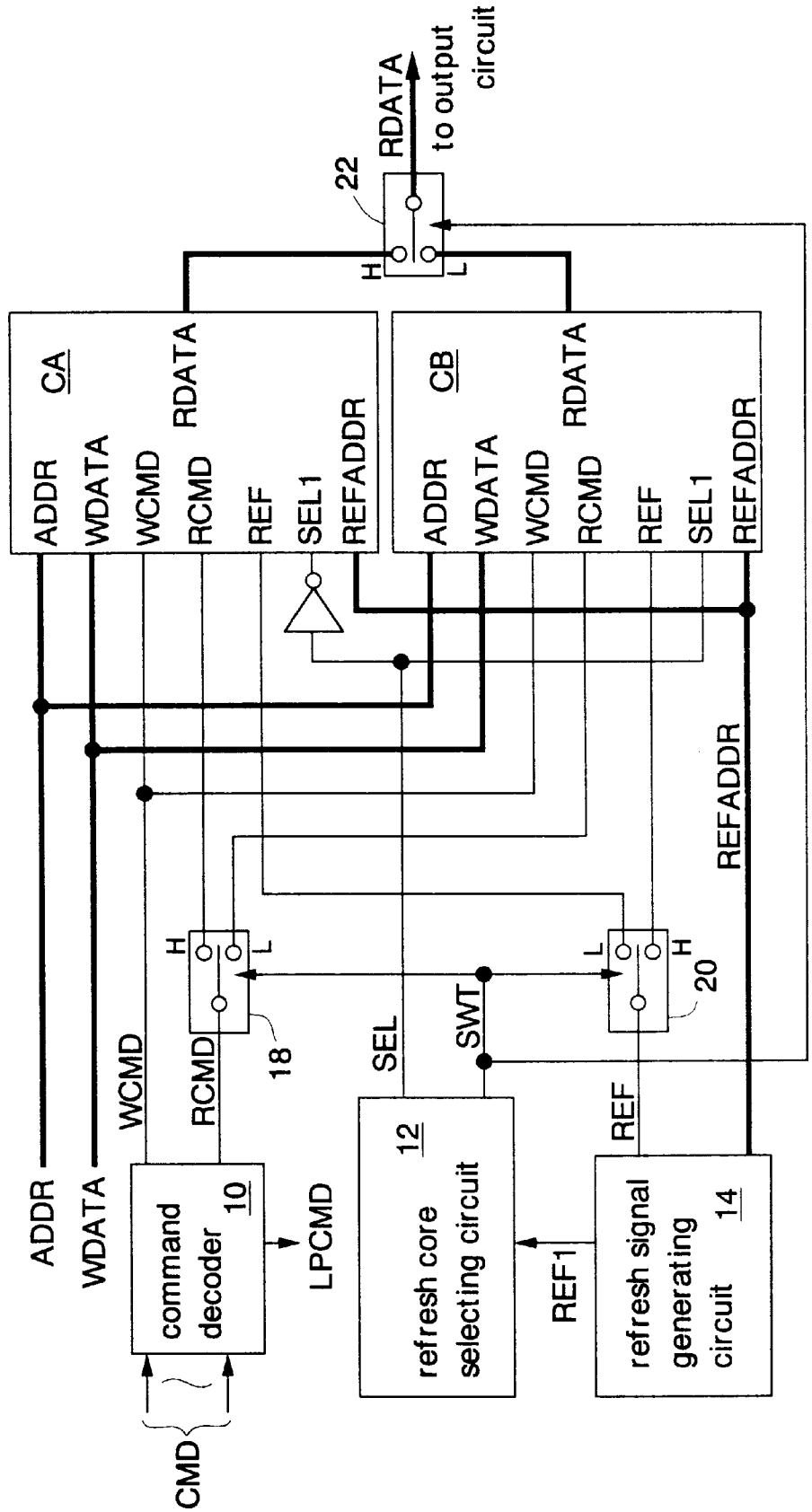
FIG. 2 is a block diagram showing a first embodiment of the semiconductor integrated circuit and the method of controlling the same according to the present invention.

FIG. 2 shows a first embodiment of the semiconductor integrated circuit and the method of controlling the same according to the present invention. In the diagrams, each of those signal lines represented by thick lines comprises a plurality of lines.

The semiconductor integrated circuit in this embodiment is constituted as a semiconductor memory having the same interface as that of an SRAM.

The semiconductor integrated circuit comprises a command decoder 10, a refresh core selecting circuit 12, a refresh signal generating circuit 14, two memory cores CA and CB, a read switch 18, a refresh switch 20, and an output switch 22. The refresh core selecting circuit 12 and the refresh switch 20 correspond to the refresh controlling circuit 2 shown in FIG. 1, and the read switch 18 to the read controlling circuit 3.

The read switch 18, the refresh switch 20, and the output switch 22 are composed of a transfer gate including a logic circuit or CMOSs. Incidentally, although it is not illustrated here, this semiconductor integrated circuit includes input circuits, output circuits, a timing generator, and the like.

The command decoder 10 receives command signals CMD, and outputs a write command signal WCMD and a read command signal RCMD. The command decoder 10 also outputs a low power mode command signal LPCMD not shown. Receiving the low power mode command signal, the semiconductor integrated circuit enters a standby state in which it is only supplied with a power supply voltage, or a self-refresh state in which it only performs refresh operations.

The refresh signal generating circuit 14 implements a timer and a counter, outputting e.g. refresh signals REF and REF1 at periods of 7.8 μs and a refresh address signal REFADDR at periods of 15.6 μs. The refresh address signal REFADDR is output by using 12 address signal lines with 4096 possible values.

The refresh core selecting circuit 12 receives the refresh signal REF1, supplies a core selecting signal SEL to each of the memory cores CA and CB, and outputs a switching signal SWT to each of the switches 18, 20, and 22.

The memory cores CA and CB include identical circuitry to each other. The memory core CA receives an address signal ADDR, a write data signal WDATA, the write command signal WCMD, the read command signal RCMD, the refresh signal REF, the inverted signal (SELL) of the core selecting signal SEL, and the refresh address signal REFADDR, and outputs a read data signal RDATA. The memory core CB receives the address signal ADDR, the write data signal WDATA, the read command signal WCMD, the read command signal RCMD, the refresh signal REF, the core selecting signal SEL (SEL1), and the refresh address signal REFADDR, and outputs a read data signal RDATA. The address signal ADDR, the write data signal WDATA, and the write command signal WCMD correspond to the write signal shown in FIG. 1.

Parenthetically, in this embodiment, the address signal ADDR is supplied together with a read command and a write command.

The read switch 18 is a circuit for outputting the read command signal RCMD to the memory core CB when the switching signal SWT is at low level, and outputting the read command signal RCMD to the memory core CA when the switching signal SWT is at high level. Here, the read command terminal RCMD of the one not selected of the memory cores CA and CB is fixed to low level.

The refresh switch 20 is a circuit for outputting the refresh signal REF to the memory core CA when the switching signal SWT is at low level, and outputting the refreshing signal REF to the memory core CB when the switching signal SWT is at high level. Here, the refresh terminal REF of the memory cores CA and CB not selected is fixed to low level.

The output switch 22 is a circuit for outputting the read data signal RDATA of the memory core CB when the switching signal SWT is at low level, and outputting the read data signal RDATA of the memory core CA when the switching signal SWT is at high level.

Figure 3:
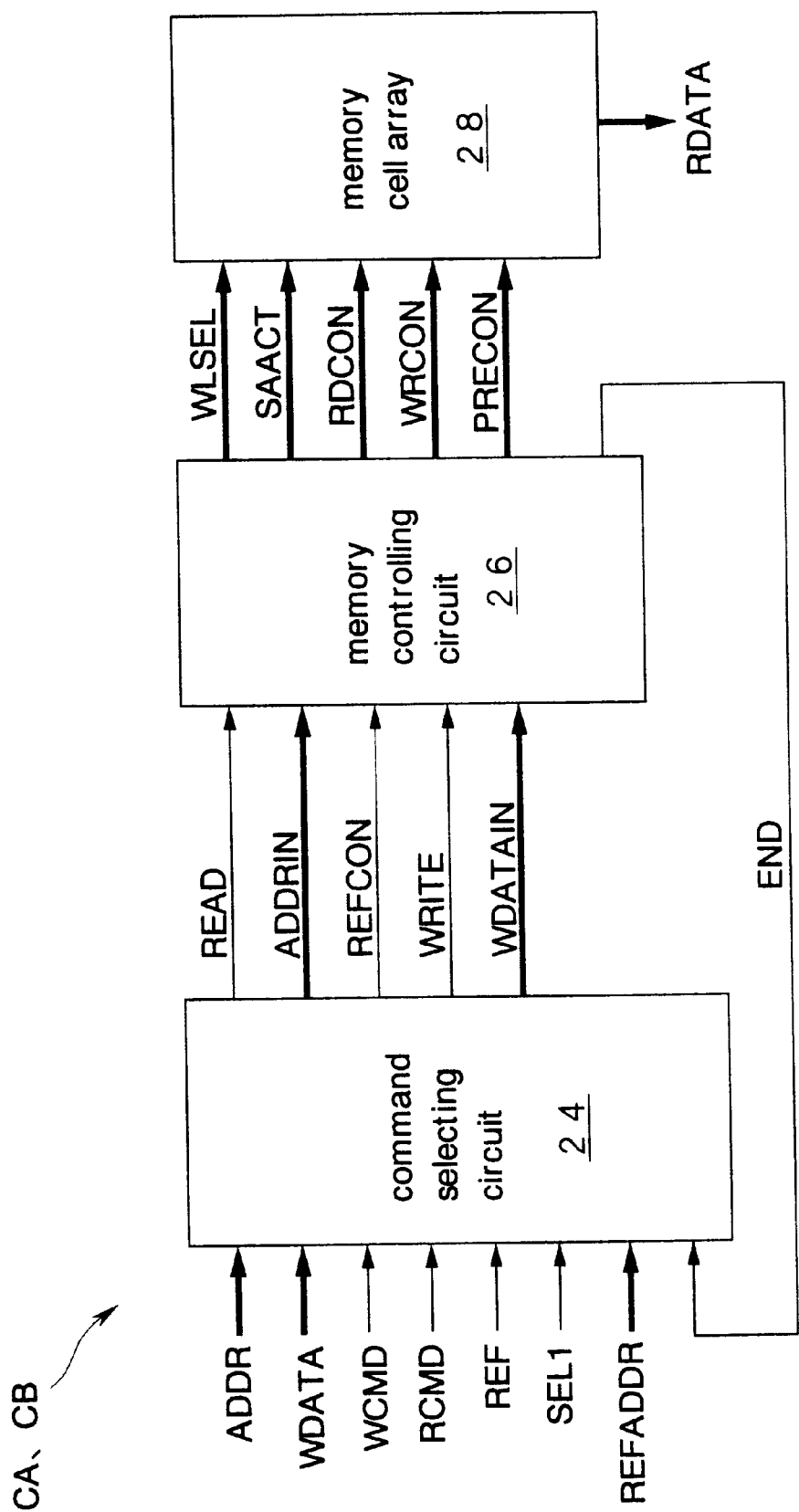
FIG. 3 is a block diagram showing the details of each of the memory cores in FIG. 2.

FIG. 3 shows the details of each of the memory cores CA and CB.

The memory core unit CA, CB includes a command selecting circuit 24, a memory controlling circuit 26, and a memory cell array 28.

The command selecting circuit 24 receives the address signal ADDR, the write data signal WDATA, the write command signal WCMD, the read command signal RCMD, the refresh signal REF, the core selecting signal SEL1, the refresh address signal REFADDR, and an end signal END, and outputs a read controlling signal READ, an internal address signal ADDRIN, a refresh controlling signal REFCON, a write controlling signal WRITE, and an internal write data signal WDATAIN.

The memory controlling circuit 26 receives the read controlling signal READ, the internal address signal ADDRIN, the refresh controlling signal REFCON, the write controlling signal WRITE, and the internal write data signal WDATAIN, and outputs a word line selecting signal WLSEL, a sense amplifier activating signal SAACT, a read data controlling signal RDCON, a write data controlling signal WRCON, a precharge controlling signal PRECON, and the end signal END.

The memory cell array 28 receives the word line selecting signal WLSEL, the sense amplifier activating signal SAACT, the read data controlling signal RDCON, the write data controlling signal WRCON, and the precharge controlling signal PRECON, and outputs the read data signal RDATA.

Each memory cell array 28 comprises 16M memory cells including the same capacitors as those of a DRAM. In other words, this semiconductor integrated circuit includes the two memory cell arrays 28 with 32M memory cells. Read operations and write operations to each of the memory cell arrays 28 are performed through 20-bit address signals and 16-bit data signals (hereinafter, also referred to as I/Os). In the present embodiment, read operations are performed by one of the memory cell arrays 28, and write operations are performed by both of the memory cell arrays 28.

Figure 4:
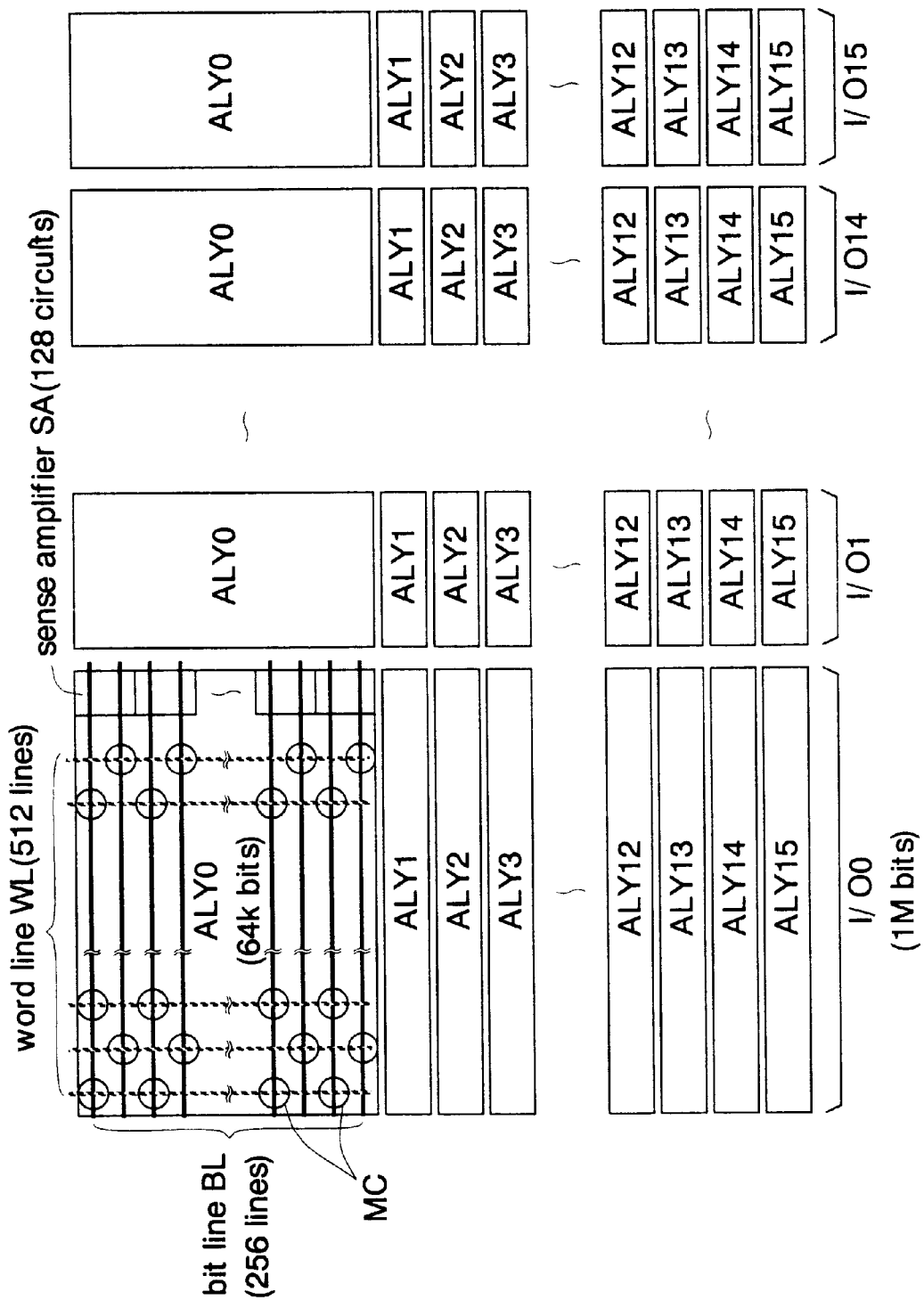
FIG. 4 is a block diagram showing the details of the memory cell array in FIG. 3.

FIG. 4 shows the details of the memory cell array 28.

The memory cell array 28 has 16 arrays ALY0–ALY15 for each I/O. The memory cell array 28 also includes not-shown controlling circuits on the periphery of the respective arrays ALY0–ALY15.

The arrays ALY0–ALY15 are formed in an identical configuration or in mirror symmetrical configurations. Each of the arrays ALY0–ALY15 has 64k-bit memory cells MC arranged 512 cells across and 128 cells down, and contains 512 word lines WL and 256 bit lines BL laid vertically and horizontally. Each of the arrays ALY0–ALY15 also has 128 sense amplifiers SA each connected with two complementary bit lines BL.

Read operations and write operations in the memory cell array 28 are performed by selecting, by I/O, the word line WL corresponding to the address from the exterior. For example, in a read operation, data are read out to the bit lines BL from the 128 memory cells MC connected to the word line WL selected. The data read out to the bit lines BL are amplified by the sense amplifiers SA. That is, the memory core CA, CB activates 2048 (128×16 I/Os) sense amplifiers SA in a read operation. Among the data amplified, those corresponding to the address from the exterior are then output to the exterior.

Meanwhile, refresh operations in the memory cell array 28 are performed by selecting the word lines WL corresponding to the refresh address signal REFADDR (of 4096 possible values) shown in FIG. 2, for four arrays (for example, ALY0–ALY3) by I/O. The memory core CA, CB activates 8192 (512×16 I/Os) sense amplifiers SA in a refresh operation. That is, the sense amplifiers SA activated in a refresh operation are four times as many as those in an ordinary operation. The refresh intervals extend with an increase in the number of sense amplifiers SA to be activated in a refresh operation. As a result, the number of refresh operations is reduced for easier control.

Figure 5:
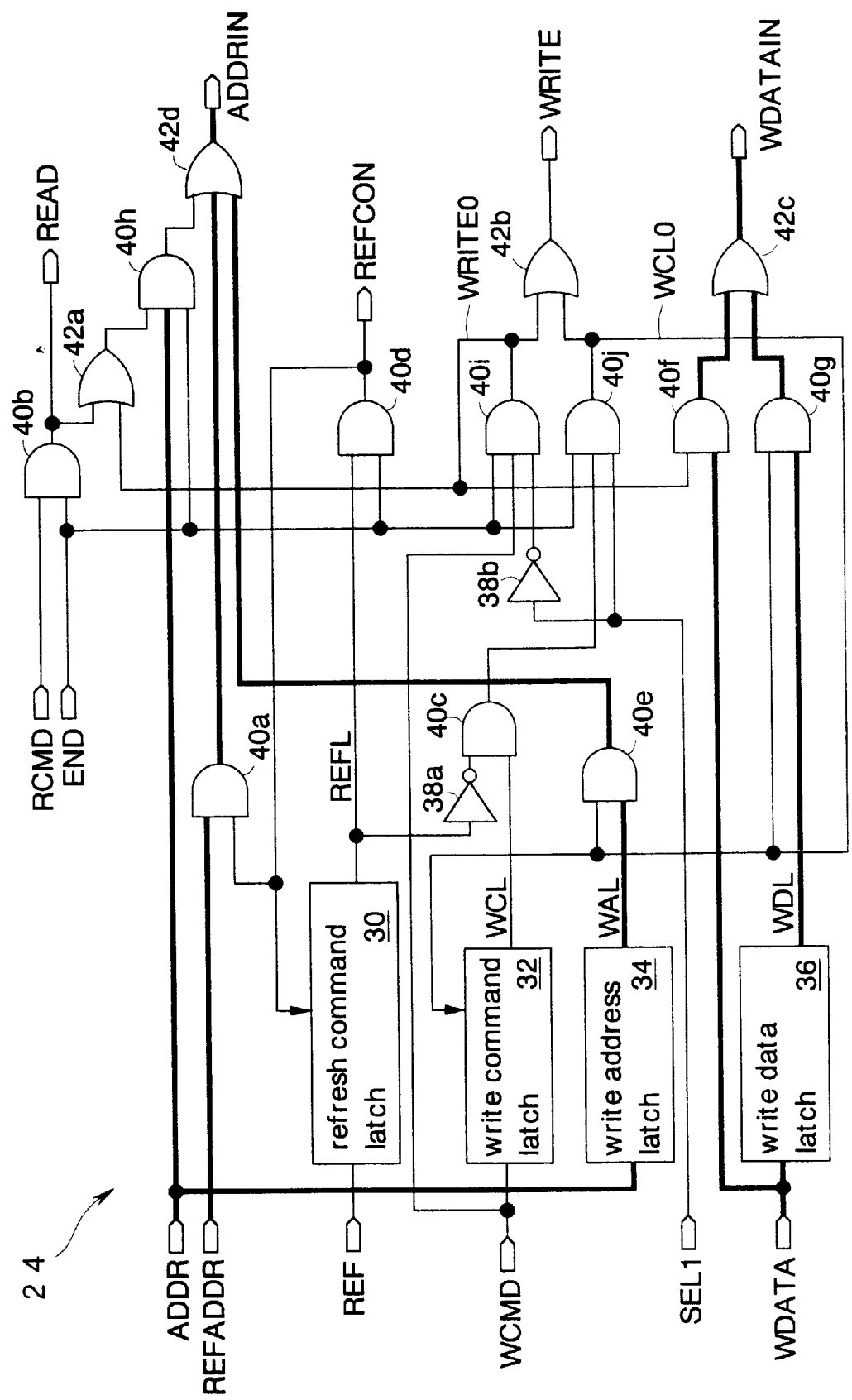
FIG. 5 is a block diagram showing the details of the command selecting circuit in FIG. 3.

FIG. 5 shows the details of the command selecting circuit 24.

The command selecting circuit 24 includes a refresh command latch 30, a write command latch 32, a write address latch 34, a write data latch 36, inverters 38a and 38b, two-input AND gates 40a, 40b, 40c, 40d, 40e, 40f, and 40g, three-input AND gates 40h, 40i, and 40j, two-input OR gates 42a, 42b, and 42c, and a three-input OR gate 42d. The refresh command latch 30 corresponds to the refresh holding circuit 4 shown in FIG. 1. The write command latch 32, the write address latch 34, and the write data latch 36 correspond to the write holding circuit 4 shown in FIG. 1. Each of the write address latch 34, write data latch 36, AND gates 40a, 40e, 40f, 40g, and 40h, and OR gate 42c and 42d comprises a plurality of pieces so as to correspond to the plurality of signal lines.

The refresh command latch 30 accepts the refresh signal REF, and outputs the accepted refresh signal as a refresh latched signal REFL. The refresh command latch 30 has the function of resetting the latch in response to the high level of the refresh controlling signal REFCON output from the AND gate 40d.

The write command latch 32 accepts the write command signal WCMD into its holding part (not shown), and outputs the accepted signal as a write command latched signal WCL. The write command latch 32 has the function of resetting the latch in response to the high level of a write command latched signal WCL0 output from the AND gate 40j.

The write address latch 34 accepts the address signal ADDR into its holding part (not shown), and outputs the accepted signal as a write address latched signal WAL.

The write data latch 36 accepts the write data signal WDATA into its holding part (not shown), and outputs the accepted signal as a write data latched signal WDL. Here, the write command latch 32, the write address latch 34, and the write data latch 36 each have a single holding part. The number of holding parts is made equal to the value of the result of "the refresh operating time" (39.5 ns) divided by "the write operating time" (39.5 ns).

The AND gate 40a receives the refresh address signal REFADDR and the refresh controlling signal REFCON, and supplies its output signal to the OR gate 42d. The AND gate 40c receives the write command latched signal WCL and, through the inverter 38a, the inverted logic of the refresh latched signal REFL, and supplies its output signal to the AND gate 40j. The AND gate 40c functions as a refresh priority circuit for performing a refresh operation prior to a write operation.

The AND gate 40e receives the write command latched signal WCL0 output from the AND gate 40j and the write address latched signal WAL, and supplies its output signal to the OR gate 42d. The AND gate 40b receives the read command signal RCMD and the end signal END, and outputs the read controlling signal READ.

The OR gate 42a receives the read controlling signal READ and a write command signal WRITE0 output from the AND gate 40i, and supplies its output signal to the AND gate 40h.

The AND gate 40h receives the output signal of the OR gate 42a, the address signal ADDR, and the end signal END, and supplies its output signal to the OR gate 42d.

The OR gate 42d receives the output signals from the AND gates 40a, 40e, and 40h, and outputs the internal address signal ADDRIN. The OR gate 42d is a circuit for outputting the write address latched signal WAL or the refresh address signal REFADDR as the internal address signal ADDRIN when the core selecting signal SEL1 is at high level, and outputting the address signal ADDR for use in a write operation or a read operation as the internal address signal ADDRIN when the core selecting signal SEL1 is at low level.

The AND gate 40d receives the refresh latched signal REFL and the end signal END, and outputs the refresh controlling signal REFCON.

The AND gate 40i receives the end signal END, the write command signal WCMD, and, through the inverter 38b, the inverted logic of the core selecting signal SEL1, and outputs the write command signal WRITE0.

The AND gate 40j receives the end signal END, the output signal of the AND gate 40c, and the core selecting signal SEL1, and outputs the write command latched signal WCL0.

The OR gate 42b receives the write command signal WRITE0 and the write command latched signal WCL0, and outputs the write controlling signal WRITE. The OR gate 42b is a circuit for outputting the write command latched signal WCL0 as the write controlling signal WRITE when the core selecting signal SEL1 is at high level, and outputting the write command signal WRITE0 as the write controlling signal WRITE when the core selecting signal SEL1 is at low level.

The AND gate 40f receives the write command signal WRITE0 and the write data signal WDATA, and supplies its output signal to the OR gate 42c.

The AND gate 40g receives the write command latched signal WCL and the write data latched signal WDL, and supplies its output signal to the OR gate 42c.

The OR gate 42c receives the output signals from the AND gates 40f and 40g, and outputs the received signals as the internal write data signal WDATAIN. The OR gates 42c is a circuit for outputting the write data latched signal WDL as the internal write data signal WDATAIN when the core selecting signal SEL1 is at high level, and outputting the write data signal WDATA as the internal write data signal WDATAIN when the core selecting signal SEL1 is at low level.

Note that the AND gates 40h, 40i, and 40f operate as the direct controlling circuit for transmitting the address signal ADDR, the write command signal WCMD, and the write data signal WDATA to the memory controlling circuit 26 directly, during a write operation in the read core.

FIG. 6 shows an overview of the control states for the memory cores CA and CB.

When the refresh core selecting circuit 12 shown in FIG. 2 sets the core selecting signal SEL and the switching signal SWT to low level, the memory core CA receives the refresh signal REF from the refresh signal generating circuit 14 and the read command signal RCMD of low level. That is, the memory core CA operates as a refresh core which performs refresh operations but no read operations. The memory core CB receives the refresh signal REF of low level and the read command signal RCMD from the command decoder 10. That is, the memory core CB operates as a read core which performs no refresh operations but read operations.

When the memory core CA receives the refresh signal REF, its command selecting circuit 24 outputs the received refresh signal REF as the refresh controlling signal REFCON, and outputs the received refresh address signal REFADDR as the internal address signal ADDRIN. Then, a refresh operation is performed.

When the memory core CA receives the write command signal WCMD, the command selecting circuit 24 outputs the internally-latched write command latched signal WCL as the write controlling signal WRITE, outputs the write address latched signal WAL as the internal address signal ADDRIN, and outputs the write data latched signal WDL as the internal write data signal WDATAIN. Then, a write operation is performed. In other words, the memory core CA, when operating as the refresh core, performs a write operation by using the signals WCL, WAL, WDL latched in the command selecting circuit 24.

When the memory core CB serving as the read core receives the read command signal RCMD, its command selecting circuit 24 outputs the read command signal RCMD as the read controlling signal READ, and outputs the address signal ADDR as the internal address signal ADDRIN. Then, a read operation is performed.

When the memory core CB receives the write command signal WCMD, the command selecting circuit 24 outputs the write command signal WCMD as the write controlling signal WRITE, outputs the address signal ADDR as the internal address signal ADDRIN, and outputs the write data signal WDATA as the internal write data signal WDATAIN. Then, a write operation is performed. In other words, the memory core CB, when operating as the read core, performs a write operation by using the signals WCMD, ADDR, and WDATA supplied from the exterior.

Figure 12:
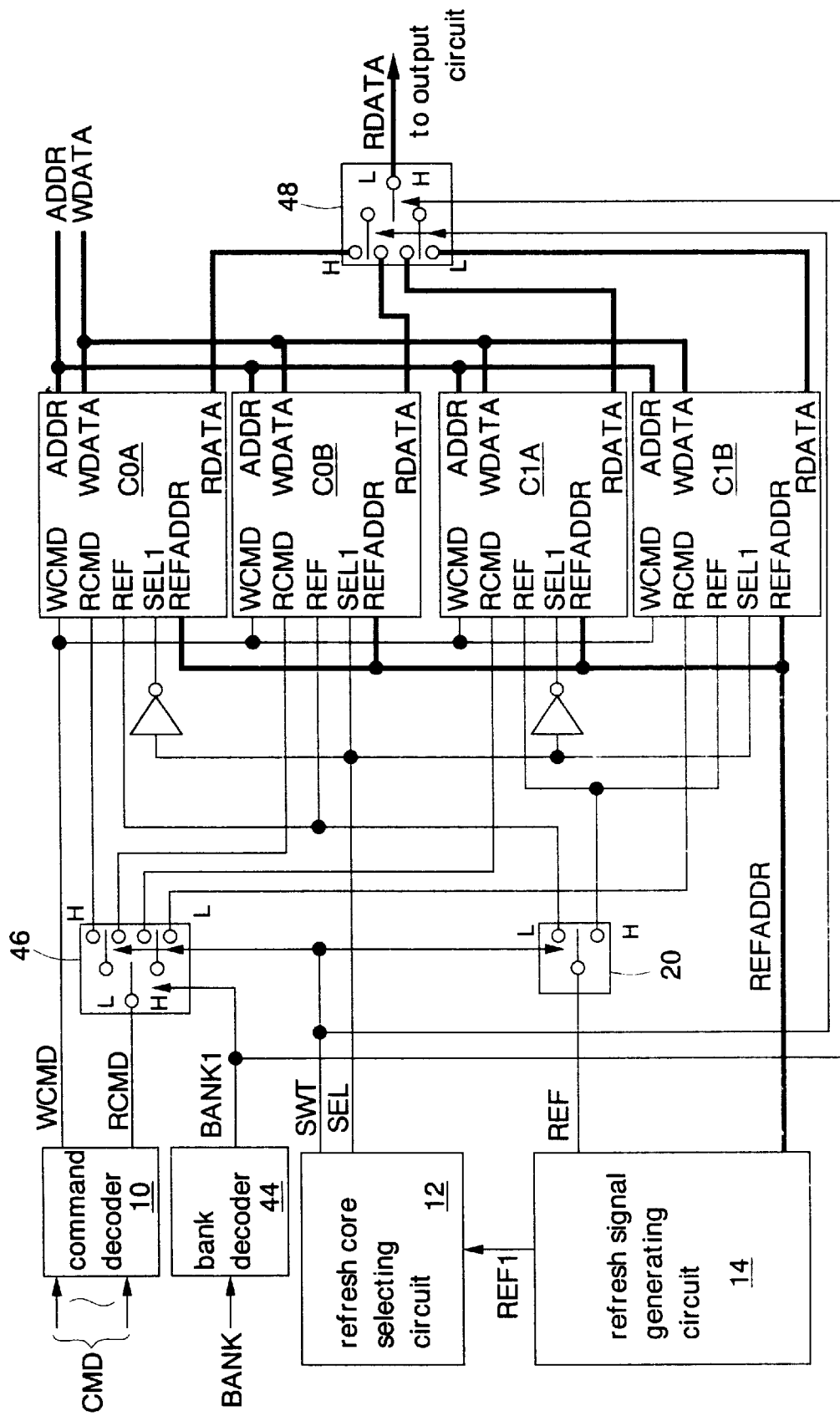
FIG. 12 is a block diagram showing a second embodiment of the semiconductor integrated circuit and the method of controlling the same according to the present invention.

Now, if the refresh core selecting circuit 12 shown in FIG. 12 sets the core selecting signal SEL and the switching signal SWT to high level, then the memory core CA operates as a read core and the memory core CB operates as a refresh core, contrary to the way mentioned above.

Figure 7:
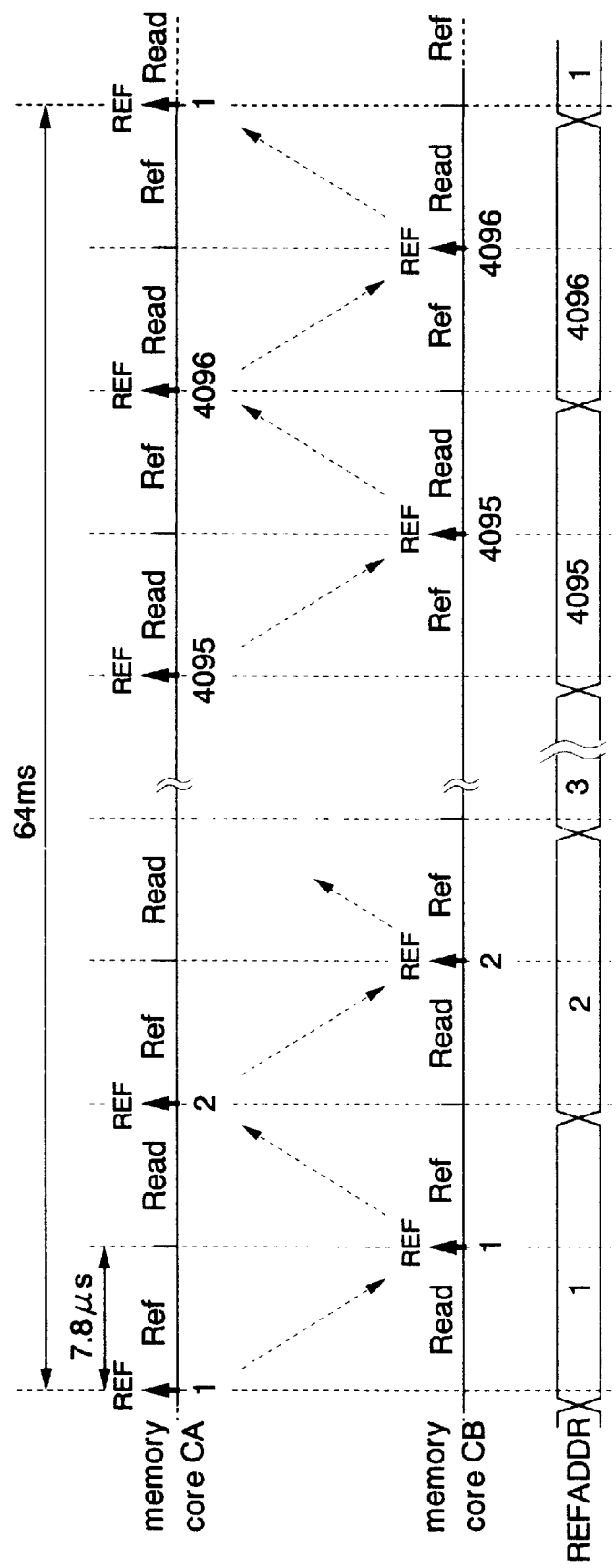
FIG. 7 is a timing chart showing an overview of the refresh operations in the first embodiment.

FIG. 7 shows an overview of the timing of refresh operations. In the chart, the denotation "Ref" indicates that the memory core is operated as a refresh core, and the description "Read" indicate that the memory core is operated as a read core. The thick arrows represent the activation of the refresh signal REF (refresh operations). The figures under the arrows indicate refresh addresses.

The semiconductor integrated circuit in this embodiment performs the refresh operations to the memory cores CA and CB alternately. More specifically, the refresh core selecting circuit 12 shown in FIG. 12 switches the core selecting signal SEL and the switching signal SWT between high and low levels at every 7.8 μs. The refresh signal generating circuit 14 outputs the refresh signal REF at every 7.8 μs, and outputs a refresh address signal REFADDR at every 15.6 μs. That is, 4096 values of refresh address signals REFADDR are output to each of the memory cores CA and CB within 64 ms.

In accordance with the controls of the core selecting signal SEL and the switching signal SWT, each of the memory cores CA and CB operates as a refresh core for 7.8 μs from a refresh operation, and operates as a read core for 7.8 μs thereafter. In other words, each of the memory cores CA and CB serves as a refresh core and a read core cyclically.

Note that read operations are performed by the read core alone and refresh operations by the refresh core alone whereas write operations by both the read core and the refresh core.

Figure 8:
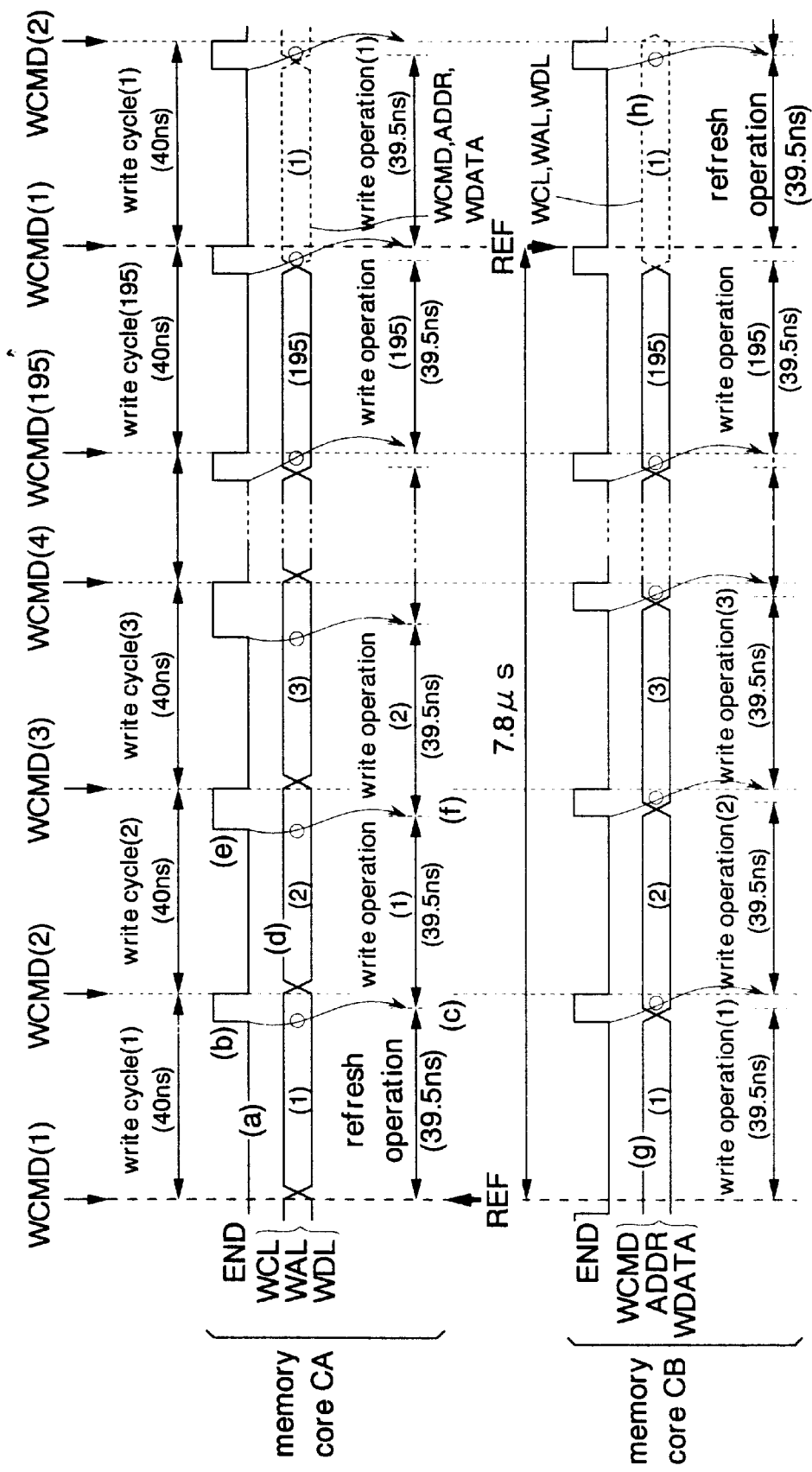
FIG. 8 is a timing chart showing an example of the operations in the first embodiment.

FIG. 8 shows an example of the operation timing of the semiconductor integrated circuit described above. This example deals with the case of performing write cycles only.

The memory core CA operates as a refresh core for a period of 7.8 μs. At this time, the memory core CB operates as a read core. Here, the present semiconductor integrated circuit is set at 40 ns in read cycle time and write cycle time, which are operation specifications. Accordingly, these operation cycles are performed 195 times for the period of 7.8 μs. Meanwhile, the read operating time and the write operating time are 39.5 ns in actual value (internal operation), compared to those of the operation cycle with a margin of 0.5 ns. This means a margin of 97.5 ns for the entire period of 7.8 μs.

Besides, the semiconductor integrated circuit precharges bit lines BL after a write, a read, or a refresh operation, and completes the operation. That is, the semiconductor integrated circuit can be operated at the same timing as that of an SRAM.

Initially, the memory core CA performs one refresh operation (thick arrow in the chart) when it is switched from a read core to a refresh core. The memory cores CA and CB receive the write command WCMD from the exterior during the refresh operation. The write command signal WCMD, the address signal ADDR, and the write data signal WDATA supplied to the memory core CA are latched into the command latch 32, the write address latch 34, and the write data latch 36 shown in FIG. 5, respectively. The latches 32, 34, and 36 output the latched signals as the write command latched signal WCL, the write address latched signal WAL, and the write data latched signal WDL, respectively (FIG. 8(a)).

The memory controlling circuit 26 shown in FIG. 3 outputs the end signal END in synchronization with the precharge operation after the refresh operation (FIG. 8(b)). The command selecting circuit 24 receives the end signal END, and controls the write operation (1) by using the signals WCL, WAL, WDL output from the latches 32, 34, and 36. Here, since the actual value of the refresh operation (39.5 ns) is shorter than a write cycle (40 ns) by 0.5 ns, the write operation (1) is started 0.5 ns earlier than the write cycle (2) (FIG. 8(c)).

Then, the memory controlling circuit 26 shown in FIG. 3 resets the end signal END in synchronization with the start of the write operation (1). While performing the write operation (1), the memory core CA receives the next write command signal WCMD and the like, and latches the received signals (FIG. 8(d)). The memory controlling circuit 26 outputs the end signal END in synchronization with the precharge operation after the write operation (FIG. 8(e)). The command selecting circuit 24 receives the end signal END, and controls the write operation (2) by using the signals WCL, WAL, and WDL output from the latches 32, 34, and 36. The write operation (2) is started 1 ns earlier than the write cycle (3) (FIG. 8(f)).

Subsequently, the write cycles (3)–(195) are performed in the same manner. Each of the write operations (2) is successively performed earlier by 0.5 ns. Accordingly, the write operation (195) is performed in synchronization with the write cycle (195). That is, the performance of the refresh operation does not show to the exterior. To be more specific, the 80th and later write operations are performed in synchronization with the respective write cycles.

Meanwhile, the memory core CB receives the write command signal WCMD, the address signal ADDR, and the write data signal WDATA, and performs the write operations (1)–(195) in sequence, in synchronization with the write cycles (1)–(195) (FIG. 8(g))

Then, after the performance of the write operation (195), the memory core CB operates as a refresh core for the following 7.8 μs period (FIG. 8(h)). At this time, the memory core CA operates as a read core.

Figure 9:
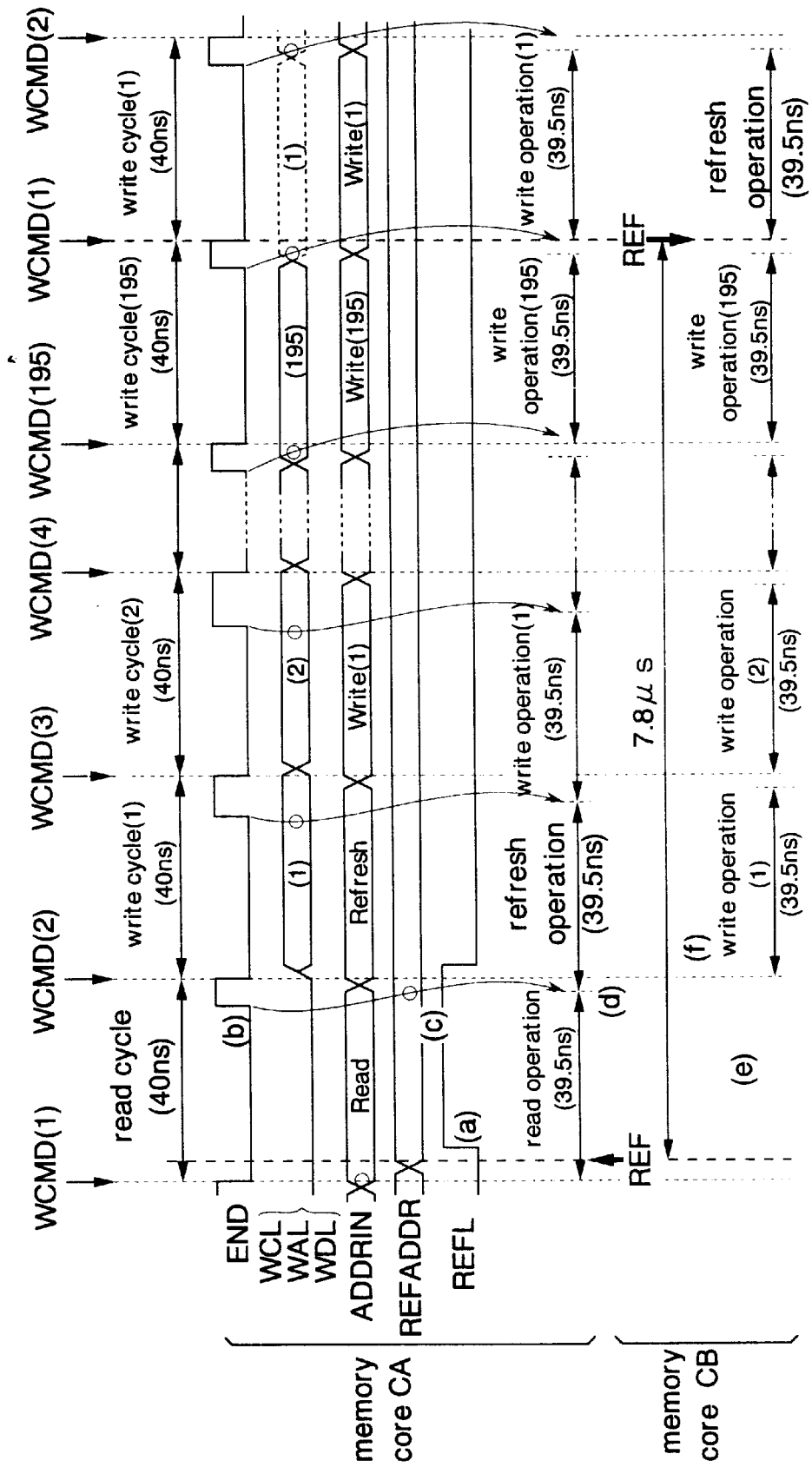
FIG. 9 is a timing chart showing the worst-case operations in the first embodiment.

FIG. 9 shows an example of the worst-case operation timing of the semiconductor integrated circuit described above.

In this example, when the memory core CA as a read core is performing a read operation, the refresh signal generating circuit 14 shown in FIG. 2 outputs the refresh signal REF. The refresh core selecting circuit 12 shown in FIG. 2 receives the refresh signal REF, and turns the core selecting signal SEL and the switching signal SWT to low level. The memory core CA is thus switched from the read core to a refresh core in the middle of the read operation. This is followed by the performance of the write cycles (1)–(195).

Initially, the refresh command latch 30 shown in FIG. 5 latches the refresh signal REF, and outputs the signal as the refresh latched signal REFL (FIG. 9(a)).

Then, the memory controlling circuit 26 shown in FIG. 3 outputs the end signal END in synchronization with the precharge after the write operation (FIG. 9(b)). The command selecting circuit 24 receives the end signal END, outputs the refresh latches signal REFL as the refresh controlling signal REFCON, and outputs the refresh address signal REFADDR as the internal address signal ADDRIN (FIG. 9(c)). Then, a refresh operation is performed. Here, the refresh signal generating circuit 14 outputs the refresh address signal REFADDR for a 15.6-s period; therefore, this address signal REFADDR is in no need of latch.

The refresh operation is started 0.5 ns earlier than the write cycle (1) (FIG. 9(d)). Then, the write operations (1)–(195) are sequentially performed as in FIG. 8. Note that the internal operations create a timing margin of 97.5 ns for the entire period of 7.8 µs as described above. Therefore, even in the worst condition, the memory core CA can perform 195 write operations, one read operation (39.5 ns), and one refresh operation (39.5 ns). That is, the performance of the refresh operation does not show to the exterior.

Meanwhile, the memory core CB does not operate during the read operation (FIG. 9(e)). Then, the memory core CB sequentially receives the write commands WCMD and the like as in FIG. 8, and performs the write operations (1)–(195) in synchronization with the write cycles (1)–(195) (FIG. 9(f)).

Figure 10:
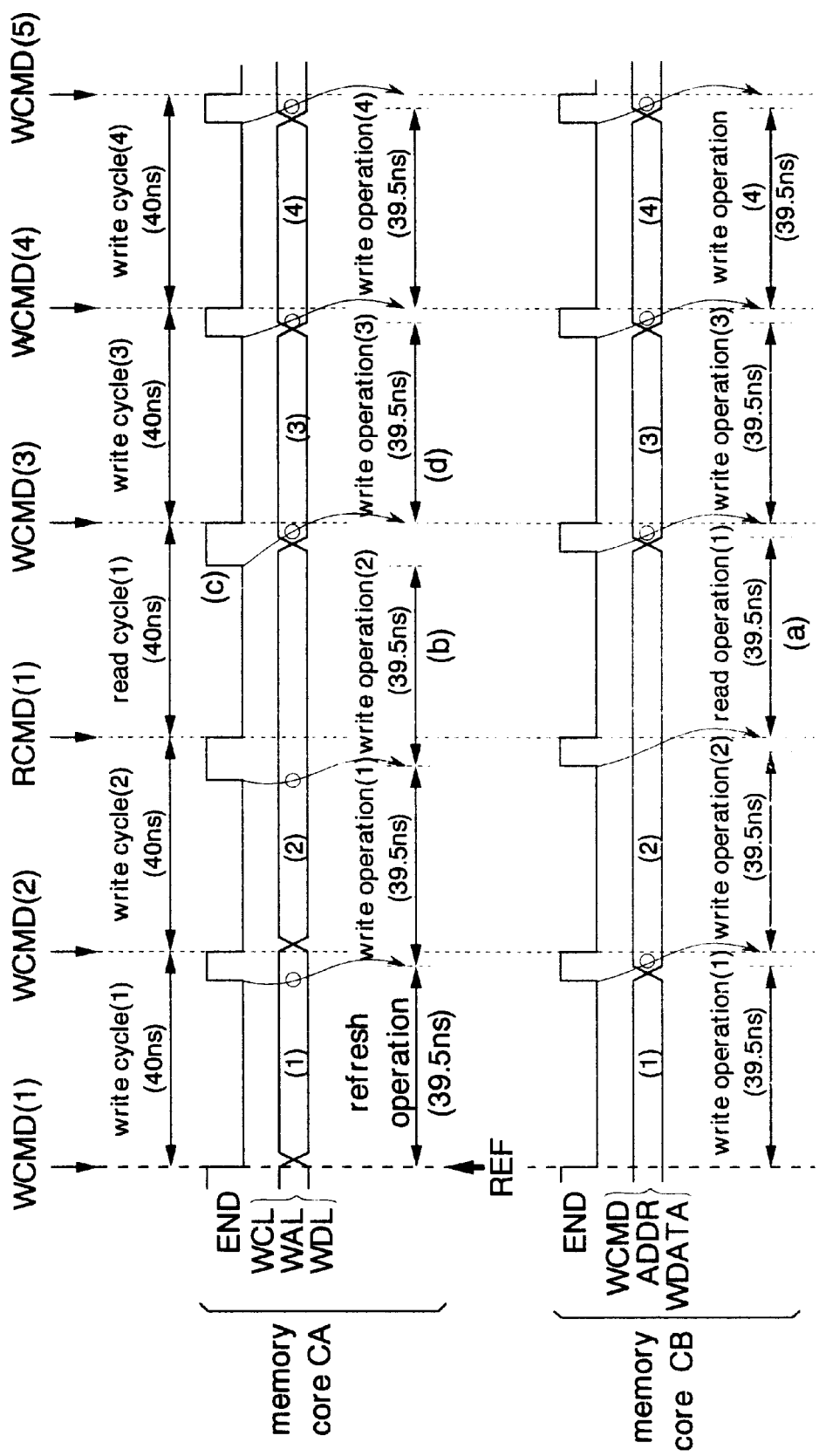
FIG. 10 is a timing chart showing another example of the operations in the first embodiment.

FIG. 10 shows another example of the operation timing of the semiconductor integrated circuit described above.

In this example, the memory core CA receives the read command RCMD in the third cycle after becoming the refresh core. The description up to the second cycle is identical to that of FIG. 8, and therefore will be omitted here.

The memory core CB receives the read command RCMD, and performs the read operation (1) (FIG. 10(a)). At this moment, the memory core CA is performing the write operation (2) (FIG. 10(b)). The memory controlling circuit 26 in the memory core CA outputs the end signal END in synchronization with the precharge after the write operation (2) (FIG. 10(c)). At this point, the memory core CA has performed all the commands received.

Subsequently, the memory cores CA and CB receive the next write command WCMD (3). The command selecting circuit 24 in the memory core CA outputs the write controlling signal WRITE, the internal address signal ADDRIN, and the internal write data signal WDATAIN to the memory controlling circuit 26 through the latches 32, 34, and 36. The memory core CA then performs the write operations in synchronization with the respective write cycles as the memory core CB does (FIG. 10(d)).

Figure 11:
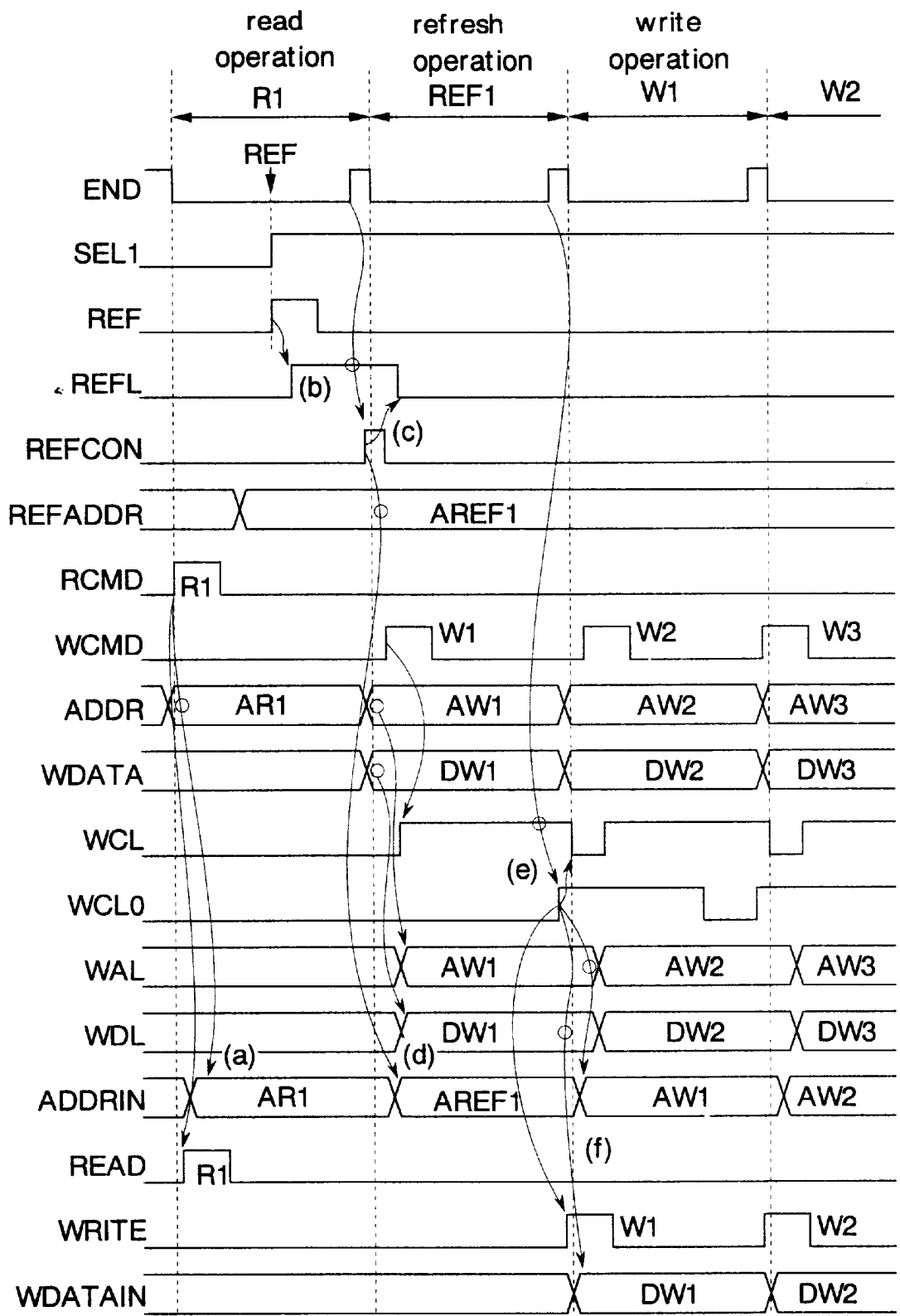
FIG. 11 is a timing chart showing the details of the operations by the command selecting circuit in FIG. 3.

FIG. 11 shows the operation timing (the details of FIG. 9) for the command selecting circuit 24.

As described above, the memory cell CA operates as a read core while receiving the low level of the core selecting signal SEL1. Here, the command selecting circuit 24 receives the read command signal RCMD from the command decoder 10 shown in FIG. 2. The AND gate 40b in the command selecting circuit 24 shown in FIG. 5 outputs the read command signal RCMD (R1) as the read controlling signal READ. The AND gate 40h and the OR gate 42d output the address signal ADDR as the internal address signal ADDRIN (FIG. 11(a)). Then, the read operation (R1) is performed.

During the read operation, the core selecting signal SEL1 is switched to high level so that the memory core CA is turned into a refresh core. The command selecting circuit 24 becomes capable of receiving the refresh signal REF. The refresh command latch 30 latches the refresh signal REF, and outputs the signal as the refresh latched signal REFL (FIG. 11(b)).

The AND gate 40d receives the end signal END after the read operation, and outputs the refresh latched signal REFL as the refresh controlling signal REFCON. The refresh command latch 30 is reset in response to the refresh controlling signal REFCON (FIG. 11(c)).

The AND gate 40a and the OR gate 42d receive the refresh controlling signal REFCON, and output the refresh address signal REFADDR (AREF1) as the internal address signal ADDRIN (FIG. 11(d)). Then, the refresh operation (REF1) is performed.

The command selecting circuit 24 receives the write command signal WCMD (W1), the address signal ADDR (AW1), and the write data signal WDATA (DW1) during the refresh operation. The write command latch 32 latches and outputs the write command signal WCMD (W1) as the write command latched signal WCL. The write address latch 34 latches and outputs the address signal ADDR (AW1) as the write address latched signal WAL. The write data latch 36 latches and outputs the write data signal WDATA (DW1) as the write data latched signal WDL (FIG. 11(d)).

The AND gate 40j receives the end signal END after the refresh operation, and outputs the write command latched signal WCL as the write command latched signal WCL0. The write command latch 32 is reset in response to the write command latched signal WCL0 (FIG. 11(e)).

The OR gate 42b outputs the received write command latched signal WCL0 as the write controlling signal WRITE (W1). The AND gate 40e and the OR gate 42d receive the write command latched signal WCL0, and output the write address latched signal WAL (AW1) as the internal address signal ADDRIN. The AND gate 40g and the OR gate 42c receive the write command latched signal WCL0, and output the write data latched signal WDL (DW1) as the internal write data signal WDATAIN (FIG. 11(f)). Then, the write operation (W1) is performed.

Subsequently, the write commands WCMD are supplied to the command selecting circuit 24 in sequence, whereby the write operations W2, W3, . . . are performed as described above.

As has been discussed, according to the semiconductor integrated circuit and the method of controlling the same in the present invention, the refresh core selecting circuit 12 controls the pair of memory cores CA and CB as a refresh core for performing a refresh operation and a read core for performing a read operation. Therefore, if a read signal is supplied while the refresh core is performing a refresh operation, the read operation is immediately performed by the read core. Therefore, even in the cases where a refresh operation and a read operation conflict with each other, the refresh operation can be automatically performed and the performance does not show to the exterior. This enables users to use the semiconductor integrated circuit without ever taking account of refresh operations.

The write cycle time (40 ns), which is one of the operation specifications, is set to be longer than the write operating time (39.5 ns) each memory core CA, CB performs. Therefore, the time difference (0.5 ns) between the write cycle and the write operation is summed up during a plurality of write cycles to create a predetermined time margin. This time margin can be utilized to perform a refresh operation, so that the performance of refresh operation, in conflict with write operations, does not show to the exterior of the semiconductor integrated circuit.

Each of the command selecting circuits 24 is provided with the write command latch 32, the write address latch 34, and the write data latch 36. These latches 32, 34, and 36 can be used in a refresh core so that the time for the refresh operation before write operations is gradually recovered from the time margins in the respective write cycles thereafter.

Each of the command selecting circuits 24 is also provided with the refresh command latch 30. Therefore, if a refresh signal REF is supplied while the refresh core is performing a write operation, the refresh signal REF can be held temporarily to perform the refresh operation after the write operation.

The refresh core selecting circuit 12 alternately switches the memory cores CA and CB between a refresh core and a read core at periods of 7.8 $\mu$s. As a result, the memory cells MC in each of the memory cells CA and CB can be refreshed at predetermined intervals, whereby it is possible to prevent the data retained in the memory cells MC from being damaged.

The memory cores CA and CB perform a refresh operation upon their switch from a read core to are fresh core. Therefore, the time spent for the refresh operation can be gradually recovered in the form of the time margins between the write cycle times and the respective write operating times thereafter.

The numbers of the command latch 32, write address latch 34, and write data latch 36 are equal to the value of the result of "the refresh operating time" (39.5 ns) divided by "the write operating time" (39.5 ns). Accordingly, the time spent for the refresh operation performed by using the latches 32, 34, and 36 before write operations can be surely recovered from the time margins in the subsequent write cycles.

The command selecting circuit 24 in the read core receives the write command signal WCMD, the address signal ADDR, and the write data signal WDATA directly with the AND gates 40i, 40h, and 40f, and uses the received signals as the write controlling signal WRITE, the internal address signal ADDRIN, and the internal write data signal WDATAIN. This facilitates the read core performing write operations in synchronization with write cycles.

The memory controlling circuit 26 outputs to the command selecting circuit 24 the end signal END for transmitting the endings of a read, a write, or a refresh operation. The command selecting circuit 24 controls the next read, write, or refresh operation in synchronization with the end signal END. Therefore, individual operations can be continuously performed to effectively secure the time margins, which are the time differences between the write cycles and the write operations.

The memory controlling circuit 26 outputs the end signal END in synchronization with the precharge operation to bit lines BL. Therefore, the semiconductor integrated circuit can be operated at the same timing as that of an SRAM, whereby the semiconductor integrated circuit is improved in usability. In other words, the present semiconductor integrated circuit can be used as an SRAM. In general, SRAMs have a memory capacity a quarter that of those DRAMs obtained through the semiconductor manufacturing processes of the same generation. For example, 16M-bit SRAMs have been developed in accordance with 64M-bit DRAMs. The present invention makes the semiconductor integrated circuit in the pair of memory cores to which the same data are written, thereby allowing a 32M-bit SRAM to be formed in accordance with a 64M-bit DRAM.

The command selecting circuit 24 performs a refresh operation prior to write operations due to the control from the AND gate 40c. The priority to the refresh operation ensures the retention of the data written to the memory cells MC.

The command decoder 10 accepts the read command RCMD, the write command WCMD, and the low power mode command LPCMD based on the command signal CMD supplied from the exterior. This facilitates the operation mode being determined by the command decoder 10.

The number of sense amplifiers SA to be operated in a refresh operation is set at four times the number of sense amplifiers SA to be operated in a read operation. This allows longer intervals between refresh operations, facilitating the control of the refresh operations. In addition, the smaller number of sense amplifiers SA to be operated in a read operation permits a reduction in power consumption.

FIG. 12 shows a second embodiment of the semiconductor integrated circuit and the method of controlling the same in the present invention. Incidentally, like components and signals to those of the first embodiment will be designated by like reference numbers or symbols, and detailed description thereof will be omitted here.

The semiconductor integrated circuit comprises a command decoder 10, a bank decoder 44, a refresh core selecting circuit 12, a refresh signal generating circuit 14, four memory cores C0A, C0B, C1A, and C1B, a read switch 46, a refresh switch 20, and an output switch 48.

The bank decoder 44 receives a bank signal BANK, which is the most significant address signal, and outputs the signal as a bank signal BANK1.

The memory cores C0A, C0B, C1A, and C1B have the same configuration as that of the memory cores CA and CB in the first embodiment. The memory cores C0A and C1A receive a core selecting signal SEL through inverters, and the memory cores C0B and C1B directly receive the core selecting signal SEL. The memory cores C0A and C0B are to be accessed when the bank signal BANK is at low level. The memory cores C1A and C1B are to be accessed when the bank signal BANK is at high level.

The read switch 46 is a switch for outputting a read command signal RCMD to one of the memory cores C0A, C0B, C1A, and C1B in accordance with the levels of the bank signal BANK and a switching signal SWT. Here, the read command terminals of the memory cores C0A, C0B, C1A, and C1B not selected are fixed to low level.

The output switch 22 is a switch for outputting the read data RDATA of the memory core C0A, C0B, C1A, or C1B in accordance with the levels of the bank signal BANK and the switching signal SWT.

FIG. 13 shows an overview of the control states for the memory cores C0A, C0B, C1A, and C1B.

When the refresh core selecting circuit 12 shown in FIG. 12 sets the core selecting signal SEL and the switching signal SWT to low level, the memory cores C0A and C1A operate as refresh cores, and the memory cores C0B and C1B operate as read cores in accordance with the bank signal BANK. When the refresh core selecting circuit 12 sets the core selecting signal SEL and the switching signal SWT to high level, the memory cores C0A and C1A operate as read core in accordance with the bank signal BANK, and the memory cores C0B and C1B operate as refresh cores.

Figure 14:
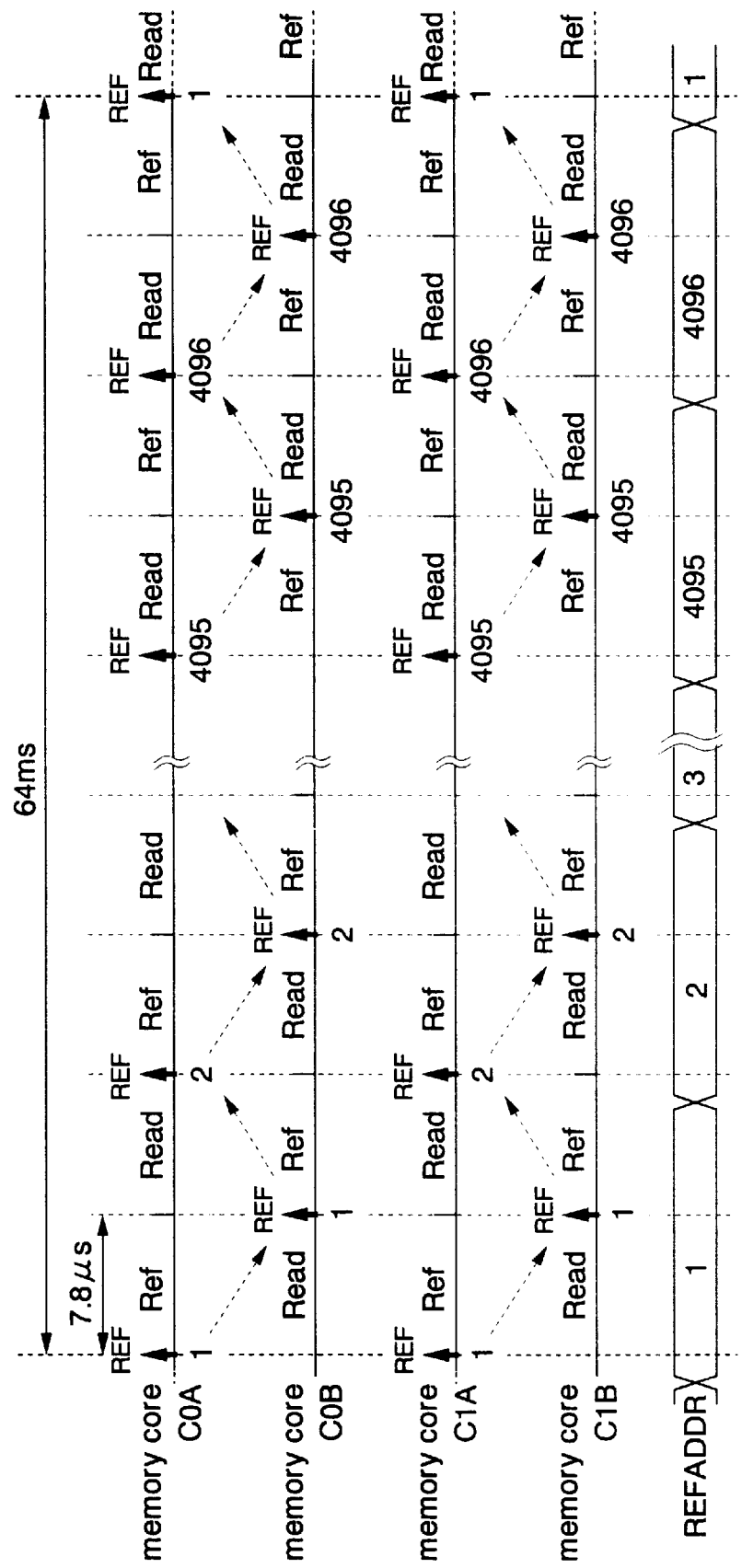
FIG. 14 is a timing chart showing an overview of the refresh operations in the second embodiment.

FIG. 14 shows an overview of the refresh operations. The denotations in the chart are the same as those in FIG. 7.

The semiconductor integrated circuit alternately performs the refresh operations to the memory cores C0A, C1A and to the memory cores C0B, C1B. More specifically, the refresh core selecting circuit 12 shown in FIG. 12 switches the core selecting signal SEL and the switching signal SWT between high level and low level at every 7.8 μs. The refresh signal generating circuit 14 outputs the refresh signal REF at every 7.8 μs, and outputs a refresh address signal REFADDR at every 15.6 μs. In other words, 4096 values of refresh address signals REFADDR are output to each of the memory cores C0A, C0B, C1A, and C1B within 64 ms.

As in the first embodiment, each of the memory cores C0A, C0B, C1A, and C1B operates as a refresh core for 7.8 μs after a refresh operation and operates as a read core for 7.8 μs thereafter, based on the control of the core selecting signal SEL and the switching signal SWT.

Note that read operations are performed by the read cores alone and refresh operations by the refresh cores alone whereas write operations by both the read and refresh cores.

This embodiment can also offer the same effect as that obtained from the first embodiment described above. Moreover, in this embodiment, the semiconductor integrated circuit is provided with the two pairs of memory cores, namely, the memory cores C0A, C0B and the memory cores C1A, C1B. Even in such a semiconductor integrated circuit as controls a plurality of memory cores on a bank basis, the performance of a refresh operation does not show to the exterior.

Figure 15:
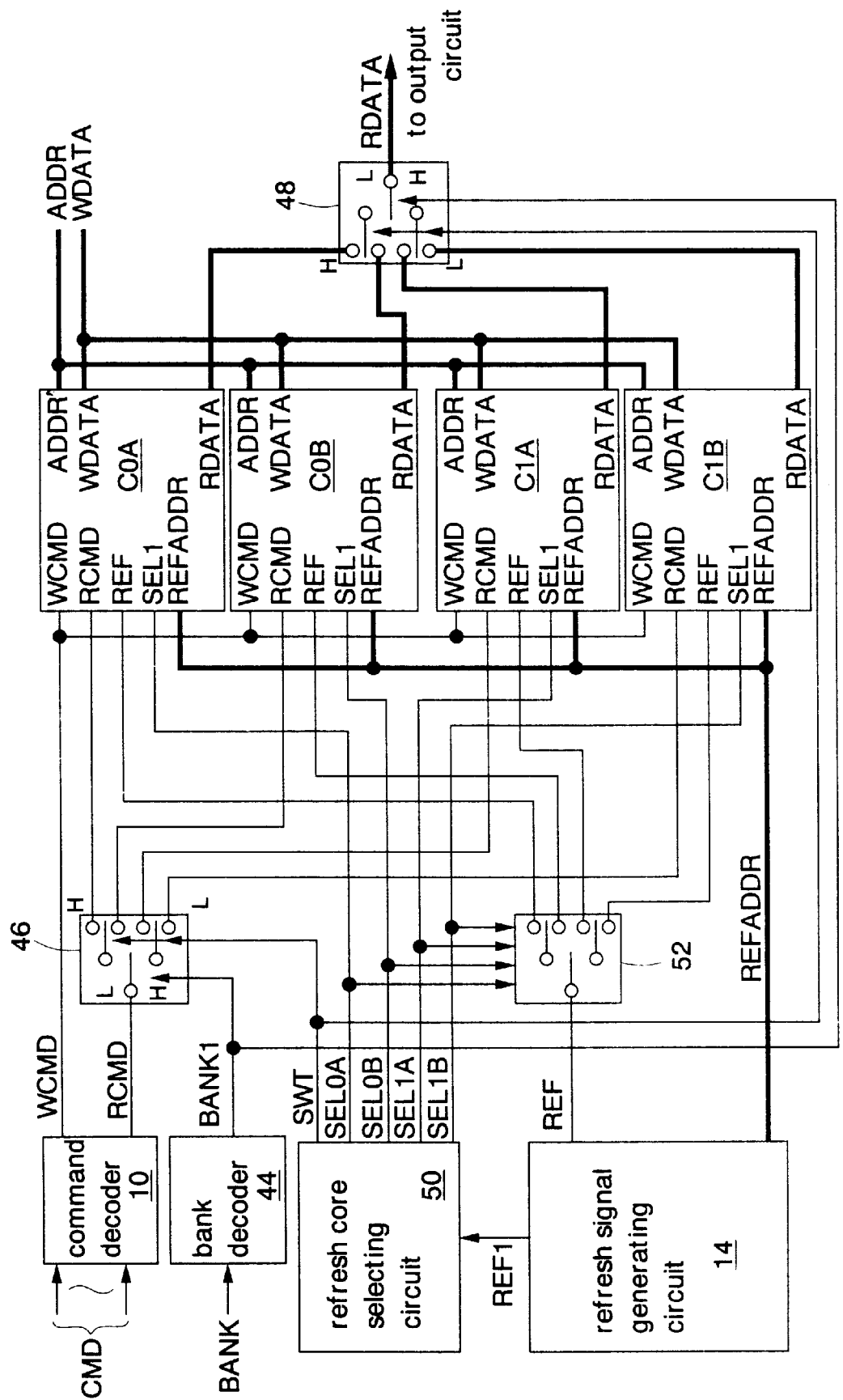
FIG. 15 is a block diagram showing a third embodiment of the semiconductor integrated circuit and the method of controlling the same according to the present invention.

FIG. 15 shows a third embodiment of the semiconductor integrated circuit and the method of controlling the same in the present invention. Incidentally, like components and signals to those of the first and second embodiments will be designated by like reference numbers or symbols, and detailed description thereof will be omitted here.

The semiconductor integrated circuit comprises a command decoder 10, a bank decoder 44, a refresh core selecting circuit 50, a refresh signal generating circuit 14, four memory cores C0A, C0B, C1A, and C1B, a read switch 46, a refresh switch 52, and an output switch 48.

The refresh core selecting circuit 50 receives a refresh signal REF1, and outputs the switching signal SWT and core selecting signals SEL0A, SEL0B, SEL1A, and SEL1B. The core selecting signals SEL0A, SEL0B, SEL1A, and SEL1B are supplied to the memory cores C0A, C0B, C1A, and C1B, respectively.

The refresh switch 52 is a switch for outputting a refresh signal REF to one of the memory cores C0A, C0B, C1A, and C1B in accordance with the levels of the core selecting signals SEL0A, SEL0B, SEL1A, and SEL1B. Here, the refresh terminals REF of those not selected of the memory cores C0A, C0B, C1A, and C1B are fixed to low level.

FIG. 16 shows an overview of the control states for the memory cores C0A, C0B, C1A, and C1B.

When the refresh core selecting circuit 50 shown in FIG. 15 sets the core selecting signal SEL0A to high level and the other signals SEL0B, SEL1A, SEL1B, and SWT to low level, the memory core C0A operates as a refresh core, and the memory cores C0B and C1B operate as read cores in accordance with the bank signal BANK. Here, the memory core C1A makes no operation. When the refresh core selecting circuit 50 sets the core selecting signal SEL0B to high level and the other signals SEL0A, SEL1A, SEL1B, and SWT to low level, the memory core C0B operates as a refresh core, and the memory cores C0A and C1A operate as read cores in accordance with the bank signal BANK. Here, the memory core C1B makes no operation. When the refresh core selecting circuit 50 sets the core selecting signal SEL1A and the switching signal SWT to high level and the other signals SEL0A, SEL0B, and SEL1B to low level, the memory core C1A operates as a refresh core, and the memory cores C0B and C1B operate as read cores in accordance with the bank signal BANK. Here, the memory core C0A makes no operation. When the refresh core selecting circuit 50 sets the core selecting signal SEL1B and the switching signal SWT to high level and the other signals SEL0A, SEL0B, and SEL1A to low level, the memory core C1B operates as a refresh core, and the memory cores C0A and C1A operate as read cores in accordance with the bank signal BANK. Here, the memory core C0B makes no operation. That is, in this embodiment, only one of the memory cores becomes the refresh core.

Figure 17:
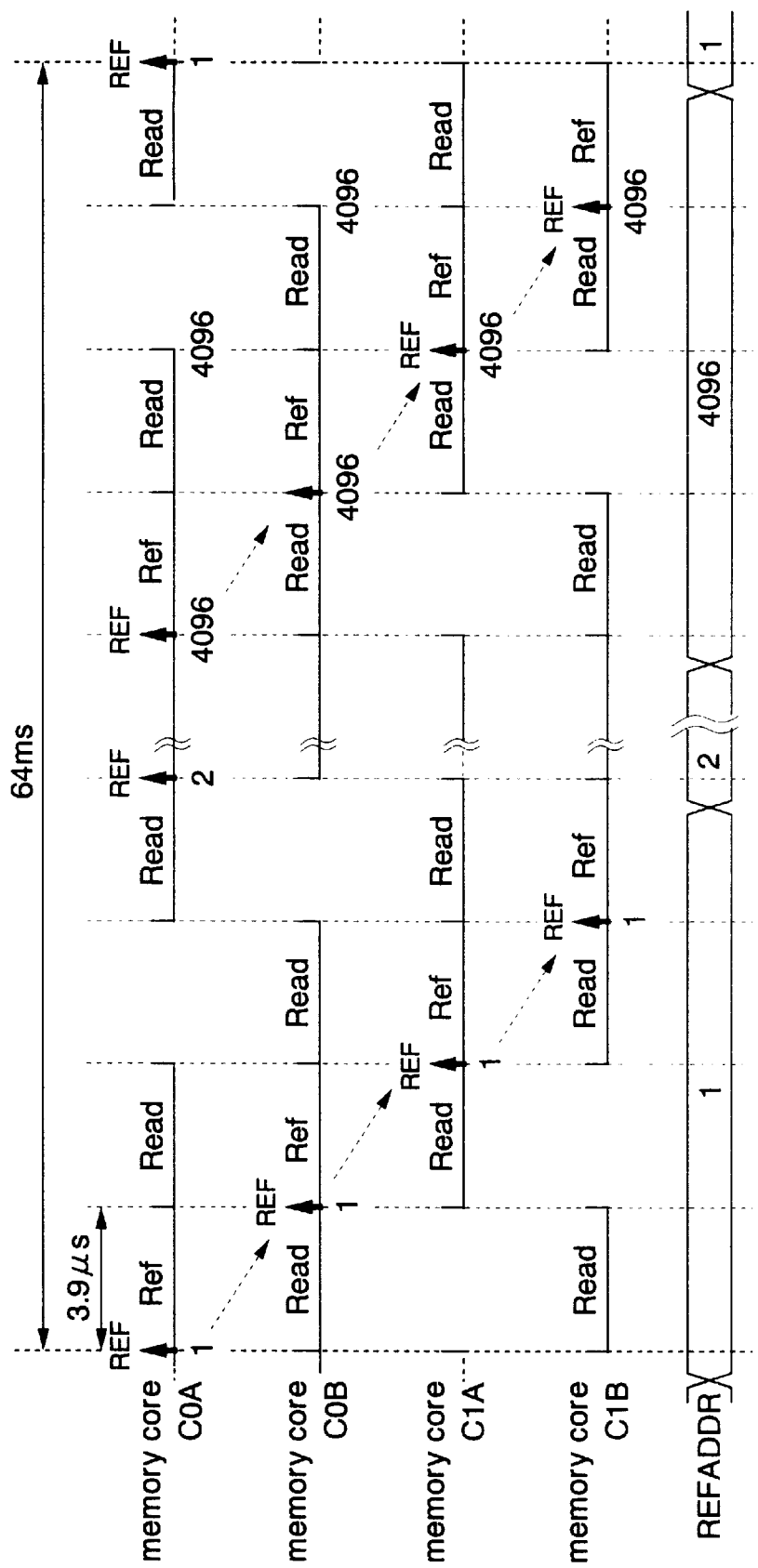
FIG. 17 is a timing chart showing an overview of the refresh operations in the third embodiment.

FIG. 17 shows an overview of the refresh operations. The denotations in the chart are the same as those in FIG. 7.

The semiconductor integrated circuit sequentially performs the refresh operations to the memory cores C0A, C0B, C1A, and C1B. The refresh core selecting circuit 50 shown in FIG. 15 sequentially turns the core selecting signals SEL0A, SEL0B, SEL1A, and SEL1B to high level at every 3.9 μs. The switching signal SWT is turned to low level when the select signal SEL0A or SEL0B is at high level, and turned to high level when the select signal SEL1A or SEL1B is at high level.

The refresh occurring signal 14 outputs the refresh signal REF at every 3.9 μs, and outputs a refresh address signal REFADDR at every 15.6 μs. That is, 4096 values of refresh address signals REFADDR are output to each of the memory cores C0A, C0B, C1A, and C1B within 64 ms.

Each of the memory cores C0A, C0B, C1A, and C1B operates as a refresh core for 3.9 μs after the first refresh operation, thereafter operates as a read core for 3.9 μs, thereafter pauses for 3.9 μs, and then operates as a read core for 3.9 μs. Read operations are performed by the read cores alone and refresh operations are performed by the refresh cores alone, whereas write operations are performed by both the read cores and the refresh core.

This embodiment can also offer the same effect as that obtained from the first and second embodiments described above. Moreover, in this embodiment, the semiconductor integrated circuit is provided with the two pairs of memory cores, namely, the memory cores C0A, C0B and the memory cores C1A, C1B to be switched by the bank signal BANK. One of these memory cores is operated as a refresh core in sequence. Since the refresh operations are performed by memory core, the number of sense amplifiers SA to be operated therein becomes half that of the second embodiment. This allows a reduction of the peak current in refresh operations.

Now, the first embodiment described above has dealt with the case where the semiconductor integrated circuit has the same interface as that of an SRAM, and is operated as an SRAM. The present invention, however, is not limited to such an embodiment. For example, the semiconductor integrated circuit may be provided with the same interface as that of a fast cycle RAM (FCRAM) or the like, and be operated as an FCRAM.

The embodiments described above have dealt with the cases where the present invention is applied to a semiconductor memory. The present invention, however, is not limited to such embodiments. For example, the present invention may be applied to a memory unit implemented in a system LSI.

The first embodiment described above has dealt with the case where the memory cores CA and CB perform a single refresh operation upon their switch from the read core to the refresh core. The present invention, however, is not limited to such an embodiment. For example, a refresh operation may be performed on each of two different word lines WL. In this case, refresh intervals may be extended.

Figure 18:
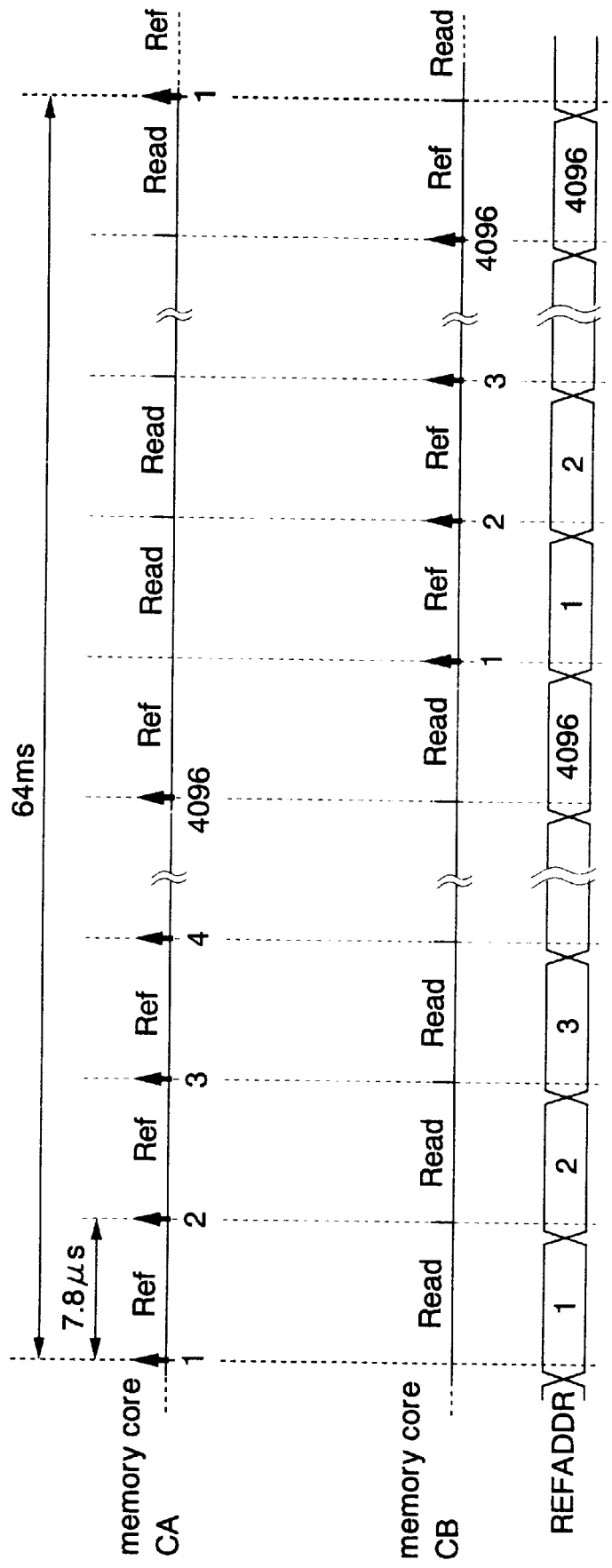
FIG. 18 is a timing chart showing another example of control of the refresh operations.

The first embodiment described above has dealt with the case where the memory cores CA and CB are refreshed alternately. The present invention, however, is not limited to such an embodiment. For example, as shown in FIG. 18, the memory core CA may be refreshed 4096 times before the memory core CB be refreshed 4096 times. It is essential only that all the memory cells MC are refreshed within 64 ms.

The first embodiment described above has dealt with the case where the memory cores CA and CB activate 2048 sense amplifiers SA in a read operation. The present invention, however, is not limited to such an embodiment. The number of sense amplifiers SA to activate in a read operation has only to be equal to or greater than 16, which corresponds to the number of I/Os. The smaller the number of sense amplifiers SA to activate is, the smaller the operating current becomes. This, on the other hand, complicates the controlling circuits.

The first embodiment described above has dealt with the case where the write command latch 32, the write address latch 34, and the write data latch 36 have a single holding part for holding the write command WCMD, the address signal ADDR, and the write data signal WDATA, respectively. The present invention, however, is not limited to such an embodiment. Given that the refresh operating time is twice as long as the write operating time or the read operating time, each of the latches 32, 34, and 36 can be provided with two holding parts so that the performances of the refresh operations do not show to the exterior.

Moreover, the first through third embodiments described above have dealt with the cases where the read data signals RDATA from the respective memory cores are selected by the output switch 22 or 48 for output. The present invention, however, is not limited to such embodiments. For example, each of the memory cores can output its data signal RDATA under high-impedance control so that the read data signals RDATA are directly connected to each other (wired OR). This eliminates the need for the output switch.

The invention is not limited to the above embodiments and various modifications may be made without departing from the spirit and the scope of the invention. Any improvement may be made in part or all of the components.

What is claimed is:

1. A semiconductor integrated circuit comprising:
    a pair of memory cores each having a plurality of memory cells including capacitors and both storing data supplied corresponding to a write command, said data being identical to each other;
    a refresh signal generating circuit for generating a refresh signal for retaining said data written in said memory cells;
    a refresh controlling circuit for supplying said refresh signal to one of said memory cores and operating the memory core as a refresh core to perform refresh and write operations; and
    a read controlling circuit for supplying a read signal for reading said data from said memory cells, to another one of said memory cores not supplied with said refresh signal and operating the memory core as a read core to perform read and write operations, wherein
        write cycle time as an operation specification is set to be longer than the actual time required for each of said memory cores to perform the write operation.

2. A semiconductor integrated circuit according to claim 1, wherein a period where said memory core operates as said refresh core is set so that the sum of each time difference between each write cycle and write operation is equal to or longer than a refresh cycle period.

3. A semiconductor integrated circuit according to claim 1, wherein each said memory core comprises a write holding circuit for holding a write signal for use in the write operation on said memory cells.

4. A semiconductor integrated circuit according to claim 3, wherein said write holding circuit comprises holding part(s), which hold(s) said write signals supplied in sequence, where the number of said holding parts is as many as or more than the value of the result of "the refresh operating time" divided by "the write operating time or the read operating time".

5. A semiconductor integrated circuit according to claim 1, wherein each said memory core comprises a refresh holding circuit for holding said refresh signal.

6. A semiconductor integrated circuit according to claim 1, wherein said refresh controlling circuit cyclically operates each said memory core as said refresh core.

7. A semiconductor integrated circuit according to claim 1, wherein said refresh controlling circuit performs at least one refresh operation at the beginning of said period where each said memory core operates as said refresh core.

8. A semiconductor integrated circuit according to claim 1, wherein each said memory core comprises a direct controlling circuit for directly receiving said write signal when operating as said read core.

9. A semiconductor integrated circuit according to claim 1, wherein each said memory core generates an end signal for notifying the endings of a read, a write, and a refresh operation.

10. A semiconductor integrated circuit according to claim 9, wherein each said memory core performs a precharge operation for precharging a bit line to a predetermined voltage in each of a read, a write, and a refresh operation and
    said end signal is output in synchronization with said precharge operation.

11. A semiconductor integrated circuit according to claim 9, wherein each said memory core includes a write holding circuit for holding a write signal for performing a write operation on said memory cells and
    performs a write operation, in response to the activation of said end signal, by using said write signal held in said write holding circuit when operating as said refresh core.

12. A semiconductor integrated circuit according to claim 11, wherein each said memory core comprises a refresh priority circuit for performing a refresh operation with priority.

13. A semiconductor integrated circuit according to claim 9, wherein each said memory core comprises a refresh holding circuit for holding said refresh signal and
    performs a refresh operation, in response to the activation of said end signal, by using said refresh signal held in said refresh holding circuit.

14. A semiconductor integrated circuit according to claim 1, comprising a command decoder for receiving at least a read command, a write command, and a low power mode command.

15. A semiconductor integrated circuit according to claim 1, wherein each said memory core comprises a plurality of sense amplifiers for amplifying the signal level of said data retained in said memory cells and the number of the sense amplifiers to be operated in a refresh operation is greater than the number of the sense amplifiers t o be operated in a read operation.

16. A method of controlling a semiconductor integrated circuit comprising a pair of memory cores each having a plurality of memory cells including capacitors and both storing data supplied corresponding to a write command, said data being identical to each other, further comprising the steps of:

generating a refresh signal for retaining said data written in said memory cells;

supplying said refresh signal to one of said memory cores and operating the memory core as a refresh core to perform refresh and write operations;

supplying a read signal for reading said data from said memory cells, to another one of said memory cores not supplied with said refresh signal and operating the memory core as a read core to perform read and write operations, and wherein write cycle time as an operation specification is set to be longer than the actual time required for each of said memory cores to perform the write operation.

17. A method of controlling a semiconductor integrated circuit according to claim 16, wherein a period where said memory core operates as said refresh core is set so that the sum of each time difference between each write cycle and write operation is equal to or longer than a refresh cycle period.

18. A method of controlling a semiconductor integrated circuit according to claim 17, wherein each said memory core holds a write signal for use in a write operation on said memory cells when operating as said refresh core and performs a write operation by using the held write signal.

19. A method of controlling a semiconductor integrated circuit according to claim 17, wherein when operating as said refresh core, each said memory core holds said refresh signal received during a write operation or a read operation and performs a refresh operation by using the held refresh signal after performing said write operation or said read operation.

* * * * *